United States Patent
Komatsuzaki et al.

(10) Patent No.: US 9,966,906 B2
(45) Date of Patent: May 8, 2018

(54) RADIO APPARATUS AND ABNORMALITY DETECTING METHOD

(71) Applicant: FUJITSU LIMITED, Kawasaki-shi, Kanagawa (JP)

(72) Inventors: Akihiko Komatsuzaki, Kawasaki (JP); Satoshi Matsubara, Kawasaki (JP); Shinichiro Kobayashi, Yokohama (JP); Hideharu Shako, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/496,124

(22) Filed: Apr. 25, 2017

(65) Prior Publication Data

US 2017/0331435 A1 Nov. 16, 2017

(30) Foreign Application Priority Data

May 10, 2016 (JP) ................. 2016-094762

(51) Int. Cl.
*H04L 25/03* (2006.01)
*H03F 1/32* (2006.01)
*H03F 3/195* (2006.01)
*H03F 3/24* (2006.01)

(52) U.S. Cl.
CPC ........... *H03F 1/3247* (2013.01); *H03F 3/195* (2013.01); *H03F 3/245* (2013.01); *H03F 2200/451* (2013.01); *H03F 2201/3224* (2013.01); *H03F 2201/3233* (2013.01)

(58) Field of Classification Search
CPC ........... H03F 1/3247; H03F 2201/3233; H03F 1/3241; H03F 2201/3227; H04B 1/0475; H04B 2001/0425; H04B 2001/0433; H04B 2001/0416; H04B 1/62; H04L 27/2614; H04L 27/368; H04W 24/02; H04W 52/367
See application file for complete search history.

(56) References Cited

U.S. PATENT DOCUMENTS

| 7,447,274 B2* | 11/2008 | Shako | ............ H03F 1/3247 375/296 |
| 2007/0188225 A1* | 8/2007 | Shako | ............ H03F 1/3247 330/149 |

(Continued)

FOREIGN PATENT DOCUMENTS

| JP | 2001-060903 | 3/2001 |
| JP | 2004-032252 | 1/2004 |

(Continued)

*Primary Examiner* — Khanh C Tran
(74) *Attorney, Agent, or Firm* — Fujitsu Patent Center

(57) ABSTRACT

A radio apparatus includes an amplifier that amplifies electrical power of a signal that is wirelessly transmitted, and a processor that executes a process including: performing, by using a distortion compensation coefficient that compensates distortion generated in the amplifier, distortion compensation of an input signal; reading, from a predetermined memory, a threshold that varies in accordance with the electrical power of the input signal; and comparing the read threshold with a monitoring target which includes the distortion compensation coefficient used with respect to the input signal to monitor whether an abnormality is present in the distortion compensation of the input signal.

11 Claims, 16 Drawing Sheets

(56) References Cited

U.S. PATENT DOCUMENTS

| | | | | |
|---|---|---|---|---|
| 2008/0068191 A1* | 3/2008 | Maeda | ............... | H03F 1/3247 340/635 |
| 2011/0187454 A1* | 8/2011 | Fudaba | ............... | H03F 1/3247 330/149 |
| 2011/0221524 A1* | 9/2011 | Matsubara | ............ | H03F 1/3247 330/149 |
| 2011/0227644 A1 | 9/2011 | Matsubara et al. | | |
| 2012/0229209 A1* | 9/2012 | Fudaba | ............... | H03F 1/3247 330/149 |

FOREIGN PATENT DOCUMENTS

| | | |
|---|---|---|
| JP | 2006-279528 | 10/2006 |
| JP | 2010-141725 | 6/2010 |
| JP | 2011-199428 | 10/2011 |
| JP | 2014-158220 | 8/2014 |

* cited by examiner

RADIO APPARATUS AND ABNORMALITY DETECTING METHOD

CROSS-REFERENCE TO RELATED APPLICATION

This application is based upon and claims the benefit of priority of the prior Japanese Patent Application No. 2016-094762, filed on May 10, 2016, the entire contents of which are incorporated herein by reference.

FIELD

The embodiments discussed herein are related to radio apparatus and an abnormality detecting method.

BACKGROUND

In recent years, for example, in a radio communication system, such as a mobile communication system, or the like, data is transmitted with high efficiency due to digitization. Specifically, for example, a multilevel phase modulation scheme is sometimes used in order to transmit multiple-bit data by a single symbol. If the multilevel phase modulation scheme is used in the radio communication system, at the transmission side, it is desirable to control nonlinear distortion by linearizing the characteristic of amplification of an electrical power amplifier that amplifies a transmission signal. However, in order to enhance the linearity of the electrical power amplifier, there is a need to use an expensive device or to increase the voltage applied to the electrical power amplifier, resulting in an increase in cost or electrical power consumption.

Thus, as a technology of distortion compensation that compensates nonlinear distortion generated in the electrical power amplifier, for example, a digital nonlinear distortion compensation (digital predistortion: DPD) scheme is sometimes used. The DPD compensates nonlinear distortion by multiplying a transmission signal by a distortion compensation coefficient that has the inverse characteristic of the nonlinear distortion generated in the electrical power amplifier. If the transmission signal in which the distortion compensation coefficient is multiplied is input to the electrical power amplifier and amplified, the distortion compensation coefficient is cancelled by nonlinear distortion at the time of amplification and thus it is possible to increase the linearity of an input and an output to and from the electrical power amplifier.

Various methods are used to implement the DPD and, in general, a lookup table (LUT) method is known. The LUT method is a method that determines addresses on the basis of electrical power of an input signal and that refers to and updates the distortion compensation coefficients stored in the LUT. The distortion compensation coefficients stored in the LUT are updated on the basis of the result of comparing an input signal with the amplitude of a feedback signal that is fed back after the amplification.

Patent Document 1: Japanese Laid-open Patent Publication No. 2011-199428
Patent Document 2: Japanese Laid-open Patent Publication No. 2006-279528
Patent Document 3: Japanese Laid-open Patent Publication No. 2010-141725
Patent Document 4: Japanese Laid-open Patent Publication No. 2014-158220

However, the distortion compensation coefficients stored in the LUT is not sometimes appropriately be updated because of a change in analog characteristics caused by a change in, for example, temperature, or the like, or because of a change in input signal. In this case, distortion compensation coefficients diverge and, consequently, adjacent channel leakage electrical power or carrier electrical power may possibly be increased. Thus, after having compared the amplitude of an input signal with that of a feedback signal, if there is a difference equal to or greater than a predetermined value, it is conceivable to stop the operation of a device assuming a failure of the device. Namely, if an error between the feedback signal and input signal is great even though the feedback signal is a signal in which the nonlinear distortion generated in the input signal has been canceled by distortion compensation coefficients, it is conceivable that appropriate distortion compensation is not performed. Consequently, if an error between the input signal and the feedback signal is great, an increase in adjacent channel leakage electrical power or the like is prevented due to a stop of the operation of the device.

Furthermore, studies have been conducted on a method of, for example, monitoring the amplitude of the signal that is output from a distortion compensation circuit and stopping, if the amplitude exceeds the allowable fluctuation range, it is also conceivable to stop distortion compensation performed by using the distortion compensation coefficients. Consequently, it is possible to stop the distortion compensation performed by inappropriate distortion compensation coefficients without stopping the operation of the device.

However, there is a problem in that, although memory effect or nonlinearity is present in the electrical power amplifier, detection of an abnormality of the distortion compensation is performed without sufficiently taking into consideration the memory effect or nonlinearity. Specifically, for example, even if an influence of the signal amplified in the electrical power amplifier in the past is received due to the memory effect in the electrical power amplifier and distortion compensation has been appropriately performed, the magnitude of the error between the input signal and the feedback signal may possibly be increased. Furthermore, because the distortion compensation coefficients are coefficients that reflect the nonlinearity of the electrical power amplifier, the allowable fluctuation range varies due to the amplitude of the signal that is output from the distortion compensation circuit.

Consequently, when an abnormality of the distortion compensation is detected, it is difficult to accurately detect an abnormality of the distortion compensation by only uniformly comparing the index value, such as an error between the input signal and the feedback signal, the amplitude output from the distortion compensation circuit, or the like, with a predetermined value.

SUMMARY

According to an aspect of an embodiment, a radio apparatus includes an amplifier that amplifies electrical power of a signal that is wirelessly transmitted, and a processor. The processor executes a process including: performing, by using a distortion compensation coefficient that compensates distortion generated in the amplifier, distortion compensation of an input signal; reading, from a predetermined memory, a threshold that varies in accordance with the electrical power of the input signal; and comparing the read threshold with a monitoring target which includes the distortion compensation coefficient used with respect to the input signal to monitor whether an abnormality is present in the distortion compensation of the input signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present invention is not limited to the embodiments.

[a] First Embodiment

Figure 1:
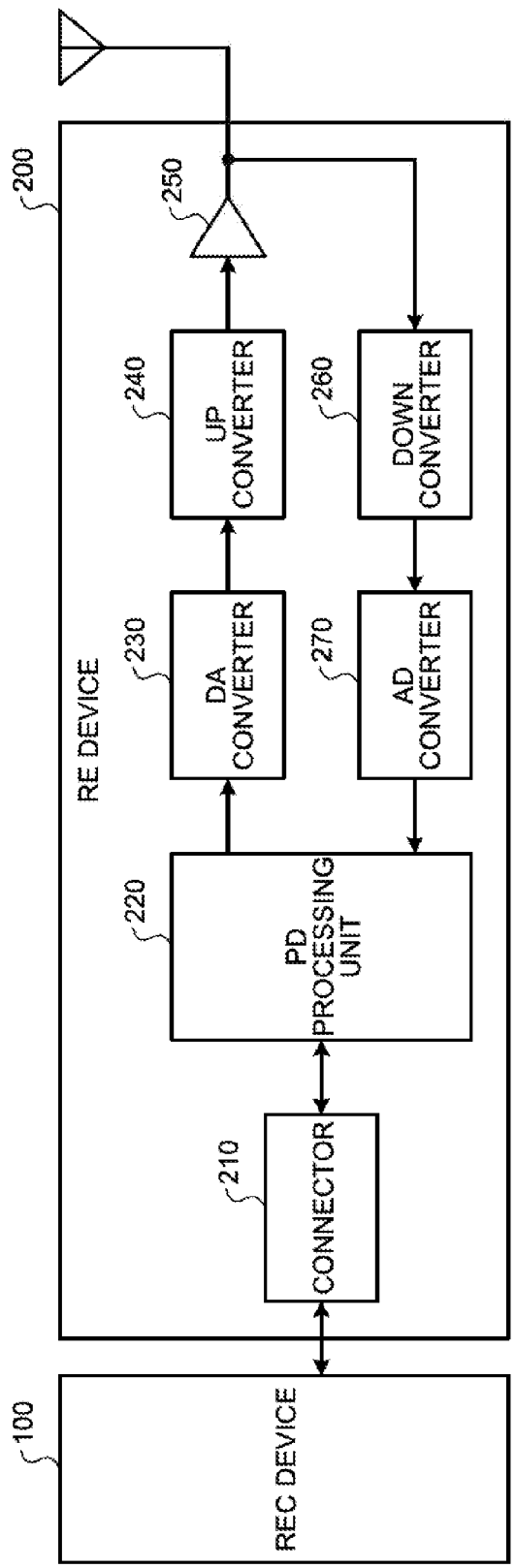
FIG. 1 is a block diagram illustrating the configuration of a radio base station system according to a first embodiment.

FIG. 1 is a block diagram illustrating the configuration of a radio base station system according to a first embodiment. The radio base station system illustrated in FIG. 1 is configured such that a radio equipment control (REC) device 100 and a radio equipment (RE) device 200 are connected by an interface, such as a common public radio interface (CPRI), or the like.

The REC device 100 is connected to the RE device 200, generates a transmission baseband signal, and sends the generated transmission baseband signal to the RE device 200. Furthermore, the REC device 100 receives a reception baseband signal from the RE device 200 and performs a reception process.

The RE device 200 receives the transmission baseband signal sent from the REC device 100 and performs a radio transmission process. Furthermore, the RE device 200 receives a signal via an antenna, performs the radio reception process on the reception signal, and sends the obtained reception baseband signal to the REC device 100.

Specifically, the RE device 200 includes a connector 210, a predistortion processing unit (hereinafter, simply referred to as a "PD processing unit") 220, a digital-to-analog (DA) converter 230, an up converter 240, and an electrical power amplifier 250. Furthermore, the RE device 200 includes a down converter 260 and an analog-to-digital (AD) converter 270. Furthermore, in FIG. 1, only a part related to signal transmission performed by the RE device 200 is illustrated and the part related to signal reception is not illustrated.

The connector 210 is a connector associated with, for example, an interface, such as a CPRI, or the like, and connects the RE device 200 to the REC device 100. Then, the connector 210 receives the transmission baseband signal sent from the REC device 100 and then outputs the received transmission baseband signal to the PD processing unit 220. Furthermore, the connector 210 sends the reception baseband signal to the REC device 100.

When the PD processing unit 220 receives an input of the transmission baseband signal from the connector 210, the PD processing unit 220 performs distortion compensation that multiplies a distortion compensation coefficient by an input signal and outputs the obtained compensation signal to the DA converter 230. Furthermore, the PD processing unit 220 performs an update process on the distortion compensation coefficient and detects an abnormality in the distortion compensation. The configuration of the PD processing unit 220 will be described in detail later.

The DA converter 230 performs DA conversion on the compensation signal and outputs the obtained analog signal to the up converter 240.

The up converter 240 up-converts an analog signal to a radio frequency and then outputs the obtained radio signal to the electrical power amplifier 250.

The electrical power amplifier 250 amplifies the radio signal, sends the radio signal from the antenna, and feeds back the signal to the down converter 260. In the electrical power amplifier 250, nonlinear distortion is generated; however, the nonlinear distortion is cancelled by the distortion compensation performed by the PD processing unit 220.

The down converter 260 down-converts the feedback signal (hereinafter, simply referred to as an "FB signal") that is fed back from the electrical power amplifier 250 to a baseband frequency and then outputs the baseband FB signal to the AD converter 270.

The AD converter 270 performs AD conversion on the FB signal and outputs the obtained digital FB signal to the PD processing unit 220.

Figure 2:
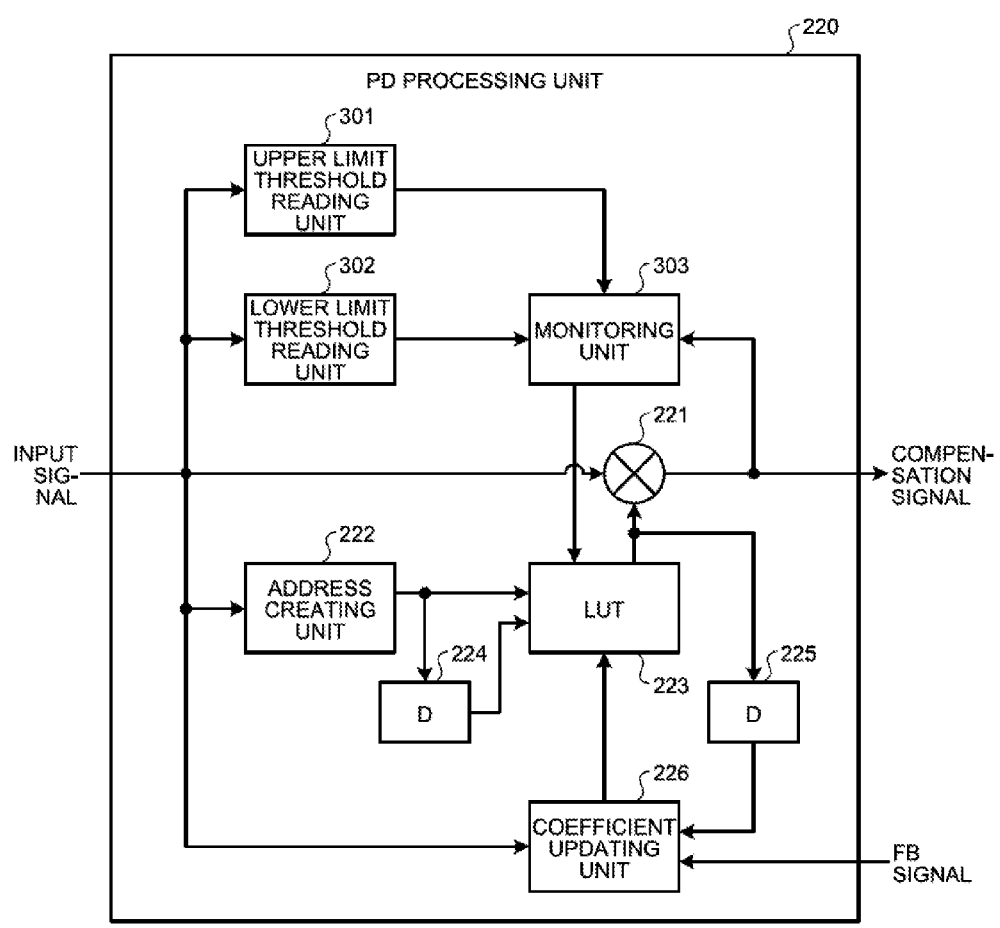
FIG. 2 is a block diagram illustrating the configuration of a PD processing unit according to the first embodiment.

FIG. 2 is a block diagram illustrating the configuration of the PD processing unit 220 according to the first embodiment. The PD processing unit 220 illustrated in FIG. 2 includes a distortion compensation unit 221, an address creating unit 222, a look-up table (LUT) 223, delay devices 224 and 225, a coefficient updating unit 226, an upper limit threshold reading unit 301, a lower limit threshold reading unit 302, and a monitoring unit 303. Furthermore, the PD processing unit 220 illustrated in FIG. 2 is configured by using a processor and a memory. As the processor, for example, a field programmable gate array (FPGA), an application specific integrated circuit (ASIC), a digital signal processor (DSP), a central processing unit (CPU), or the like, may be used. Furthermore, as the memory, for example, a read only memory (ROM), a random access memory (RAM), a dual port RAM, or the like, may be used.

The distortion compensation unit 221 multiplies a distortion compensation coefficient read from the LUT 223 by an input signal and performs distortion compensation on the input signal. Namely, the distortion compensation unit 221 acquires, from the LUT 223, the distortion compensation coefficient that has the inverse characteristic of the nonlinear distortion generated in the electrical power amplifier 250, multiplies the distortion compensation coefficient by the input signal, and generates the compensation signal in which the nonlinear distortion has been compensated.

The address creating unit 222 creates, on the basis of the input signal, the addresses of the distortion compensation coefficients associated with the input signal. Specifically, the address creating unit 222 creates the addresses that are associated with the electrical power of, for example, the input signal and then outputs the created addresses to the LUT 223. Furthermore, the address creating unit 222 also outputs the created addresses to the delay device 224.

The LUT 223 stores distortion compensation coefficients in a plurality of respective addresses. Then, when the addresses are output from the address creating unit 222, the LUT 223 outputs, to the distortion compensation unit 221 and the delay device 225, the distortion compensation coefficients stored in the respective output addresses. Furthermore, when the addresses are output from the delay device 224, the LUT 223 updates the distortion compensation coefficients stored in the respective output addresses.

The delay device 224 holds the addresses created by the address creating unit 222 for a period of time corresponding to a processing delay of the FB signal until the FB signal is fed back to the PD processing unit 220. Then, the delay device 224 outputs, to the LUT 223, the addresses held for the period of time corresponding to the processing delay. These addresses is the addresses of the distortion compensation coefficients targeted for an update and then distortion compensation coefficients stored in this addresses are rewritten in the LUT 223.

The delay device 225 holds the distortion compensation coefficients output from the LUT 223 for the period of time corresponding to the processing delay of the FB signal until the FB signal is fed back to the PD processing unit 220. Then, the delay device 225 outputs, to the coefficient updating unit 226, the distortion compensation coefficients held for the period of time corresponding to the processing delay. These distortion compensation coefficients are updated by the coefficient updating unit 226 and are rewritten in the LUT 223.

The coefficient updating unit 226 updates the distortion compensation coefficients output from the delay device 225 and allows the updated distortion compensation coefficients to be stored in the respective addresses that are stored in the LUT 223 and that are output from the delay device 224. Specifically, the coefficient updating unit 226 updates the distortion compensation coefficients output from the delay device 225 such that the magnitude of an error between the input signal and the FB signal is decreased. Namely, the coefficient updating unit 226 calculates an amount of update on the basis of the error between the input signal and the FB signal and adds the calculated amount of update to the distortion compensation coefficients that are output from the delay device 225. Then, the coefficient updating unit 226 outputs the obtained updated distortion compensation coefficients to the LUT 223 and allows the updated distortion compensation coefficients to be stored in the respective addresses that are output from the delay device 224.

The distortion compensation performed by these processing units is monitored by the upper limit threshold reading unit 301, the lower limit threshold reading unit 302, and the monitoring unit 303 and an abnormality of the distortion compensation is detected.

The upper limit threshold reading unit 301 reads the upper limit thresholds associated with the electrical power of the input signal from a memory (not illustrated), or the like. Namely, the upper limit threshold reading unit 301 reads, from the memory, or the like, the upper limit allowed for the electrical power of the compensation signal that corresponds to the monitoring target. The upper limit threshold reading unit 301 sets the read upper limit thresholds in the monitoring unit 303.

The lower limit threshold reading unit 302 reads the lower limit thresholds associated with the electrical power of the input signal from the memory (not illustrated) or the like. Namely, the lower limit threshold reading unit 302 reads, from the memory, or the like, the lower limit allowed for the electrical power of the compensation signal that corresponds to the monitoring target. The lower limit threshold reading unit 302 sets the read lower limit thresholds in the monitoring unit 303.

The monitoring unit 303 acquires the electrical power of the compensation signal output from the distortion compensation unit 221 and determines whether the electrical power of the compensation signal is included in the allowable ranges specified by the upper limit thresholds and the lower limit thresholds. Then, if the electrical power of the compensation signal is not included in the allowable ranges specified by the upper limit thresholds and the lower limit thresholds, the monitoring unit 303 determines that an abnormality has occurred in the distortion compensation and initializes the LUT 223.

In the first embodiment, the electrical power of the compensation signal output from the distortion compensation unit 221 corresponds to the monitoring target and it is monitored whether the electrical power of the compensation signal is included in the allowable ranges that are specified by the thresholds. At this time, the upper limit threshold reading unit 301 and the lower limit threshold reading unit 302 read the upper limit thresholds and the lower limit thresholds that are different in accordance with the electrical power of the input signal from a memory (not illustrated), or the like. Specifically, for example, as illustrated in FIG. 3, the upper limit thresholds and the lower limit thresholds that specify respective allowable ranges 351 to 358 that are different in each of sections of the input electrical power.

Figure 3:
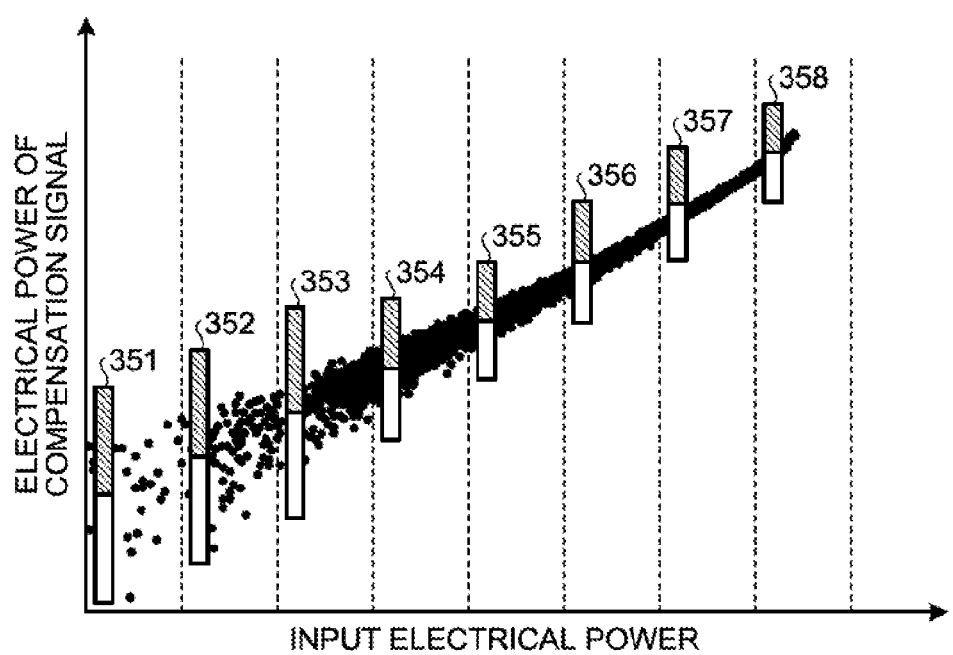
FIG. 3 is a schematic diagram illustrating a specific example of thresholds for each section according to the first embodiment.

In FIG. 3, the allowable ranges 351 to 358 of the electrical power of the compensation signal in each of the sections are illustrated and specific examples of the electrical power of the compensation signal are plotted. Furthermore, in the allowable ranges 351 to 358, the ranges in each of which the upper limit threshold and the lower limit threshold are higher than the central value are indicated by the shaded bars and the ranges in each of which the upper limit threshold and the lower limit threshold are lower than the central value are indicated by the white bars. The width of each of the allowable ranges 351 to 358 in the sections is specified by the upper limit thresholds and the lower limit thresholds.

As illustrated in FIG. 3, in the sections in each of which the electrical power of the input signal is relatively low, the width of the allowable ranges is smaller as the electrical power of the input signal is increased. In other words, in the sections in each of which the input electrical power is equal to or less than the predetermined electrical power, for example, as indicated by the allowable ranges 351 to 355, the width of the allowable ranges is greater as the electrical power of the input signal is decreased and these sections are included in the allowable ranges specified by the thresholds even if the electrical power of the compensation signal vary.

In this way, the reason that the width of the allowable ranges is great in the sections in each of which the electrical power of the input signal is low is as follows. Namely, if the electrical power of the input signal is low, the influence of the memory effect in the electrical power amplifier 250 tends to be large and the accuracy of the update of the distortion compensation coefficients in the coefficient updating unit 226 is not so high. Consequently, the electrical power of the compensation signal obtained by the distortion compensation unit 221 being multiplied by the distortion compensation coefficient greatly varies. In this way, large variations in the electrical power of the compensation signal is not caused by, for example, an abnormality, such as a failure of a circuit, but is caused by the memory effect in the electrical power amplifier 250; therefore, in the sections in each of which the electrical power of the input signal is low, the allowable ranges are set to high.

In contrast, in the sections in each of which the electrical power of the input signal is relatively high, compared with the other sections, both the upper limit thresholds and the lower limit thresholds are shifted to the high side. In other words, for example, in FIG. 3, in the sections in each of which the input electrical power is equal to or less than the predetermined electrical power, for example, as indicated by the allowable ranges 351 to 356, the central value of the upper limit thresholds and the lower limit thresholds is linearly increased, whereas, in the sections in each of which the input electrical power exceeds the predetermined electrical power, for example, as indicated by the allowable ranges 357 and 358, the central value of the upper limit thresholds and the lower limit thresholds is located at the position higher than this straight line.

In this way, the reason that the allowable ranges are shifted to the high side in the sections in each of which the electrical power of the input signal is high is as follows. Namely, if the electrical power of the input signal is high, the electrical power amplifier 250 is operated in the vicinity of the saturation region and the nonlinear distortion becomes large. Consequently, if the electrical power of the input signal is high, the distortion compensation coefficients having the inverse characteristic of the nonlinear distortion also become large and thus the electrical power of the compensation signal output from the distortion compensation unit 221 is accordingly shifted to the high side. In this way, the shift of the electrical power of the compensation signal to the high side is not caused by, for example, an abnormality, such as a failure of a circuit, but is caused by the nonlinearity of the electrical power amplifier 250; therefore, in the sections in each of which the electrical power of the input signal is high, the upper limit thresholds and the lower limit thresholds are shifted to the side higher than the other sections.

Figure 4:
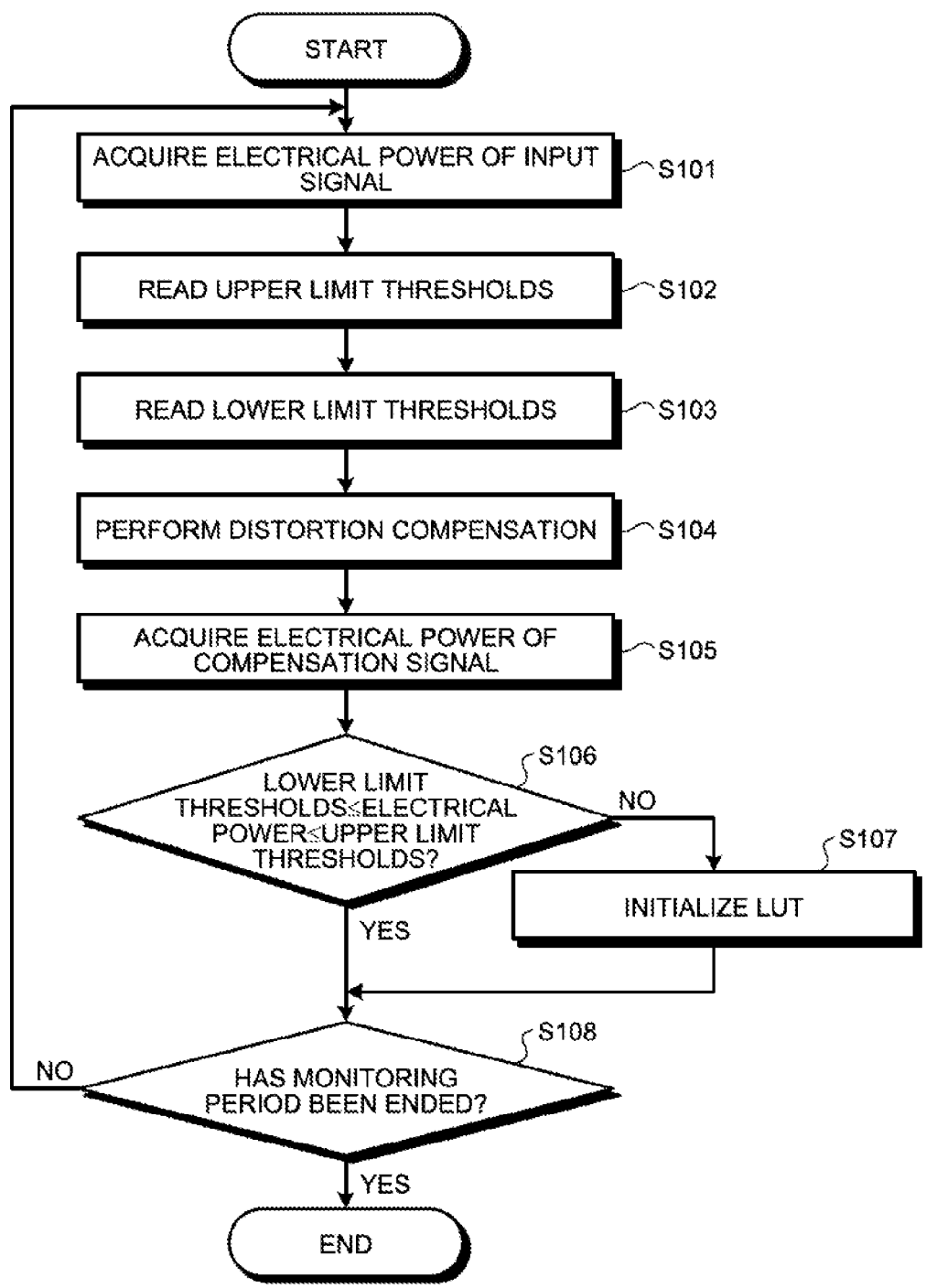
FIG. 4 is a flowchart illustrating the flow of a monitoring process according to the first embodiment.

In the following, a monitoring process of distortion compensation performed by the PD processing unit 220 configured described above will be described with reference to the flowchart illustrated in FIG. 4.

If an input signal is input to the PD processing unit 220, the electrical power of the input signal is acquired by the upper limit threshold reading unit 301 and the lower limit threshold reading unit 302 (Step S101). Then, the upper limit thresholds associated with the electrical power of the input signal are read by the upper limit threshold reading unit 301 from a memory (not illustrated) or the like (Step S102). Similarly, the lower limit thresholds associated with the electrical power of the input signal are read by the lower limit threshold reading unit 302 from a memory (not illustrated) or the like (Step S103). The upper limit thresholds and the lower limit thresholds specify the allowable ranges of the electrical power of the compensation signal that corresponds to the monitoring target performed by the monitoring unit 303. The read upper limit thresholds and the lower limit thresholds are set in the monitoring unit 303.

In contrast, the input signal is also input to the distortion compensation unit 221 and the address creating unit 222 and the distortion compensation is performed (Step S104). Specifically, the addresses associated with, for example, the electrical power of the input signal are created by the address creating unit 222 the distortion compensation coefficients stored in the created addresses are output from the LUT 223 to the distortion compensation unit 221. Then, because each of the distortion compensation coefficients is multiplied by the input signal by the distortion compensation unit 221, the compensation signal that has been subjected to the distortion compensation is output.

In the first embodiment, because the electrical power of the compensation signal corresponds to the monitoring target, the electrical power of the compensation signal is acquired by the monitoring unit 303 (Step S105). Then, it is determined, by the monitoring unit 303, whether electrical power of the compensation signal is included in the allowable ranges that are specified by the upper limit thresholds and the lower limit thresholds (Step S106). If the result of this determination indicates that electrical power of the compensation signal is included in the allowable ranges (Yes at Step S106), it is determined that no abnormality occurs in the distortion compensation and the process is continued. In contrast, if the electrical power of the compensation signal is not included in the allowable ranges (No at Step S106), it is determined that an abnormality occurs in the distortion compensation and an action with respect to the abnormality is taken. Specifically, for example, the LUT 223 is initialized by the monitoring unit 303 (Step S107) and all of the distortion compensation coefficients stored in the LUT 223 are changed to the initial values.

Because such monitoring of the distortion compensation is performed in a predetermined monitoring period, it is determined, by the monitoring unit 303, whether the monitoring period has been ended (Step S108) and, if the monitoring period continues (No at Step S108), the monitoring process described above is repeated. Then, if the monitoring period has been ended (Yes at Step S108), the monitoring process is ended.

As described above, according to the embodiment, in accordance with the electrical power of the input signal, the upper limit thresholds and the lower limit thresholds of the electrical power of the compensation signal that corresponds to the monitoring target are set and it is monitored whether the electrical power of the compensation signal is included in the allowable ranges. Furthermore, the upper limit thresholds and the lower limit thresholds that are in accordance with the electrical power of the input signal increase the width of the allowable ranges in the sections in each of which the electrical power of the input signal is low and shift the allowable ranges to the high side in the sections in each of which the electrical power of the input signal is high. Consequently, it is possible to set, for each electrical power of the input signal, the allowable ranges by taking into consideration the memory effect and the nonlinearity of the electrical power amplifier and it is possible to accurately detect an abnormality of the distortion compensation.

[b] Second Embodiment

The characteristic of a second embodiment is that the monitoring target is set to the input/output ratios of the distortion compensation unit.

The configuration of a radio base station system according to the second embodiment is the same as that described in the first embodiment (FIG. 1); therefore, descriptions thereof will be omitted. In the second embodiment, the configuration of the PD processing unit 220 is different from that described in the first embodiment.

Figure 5:
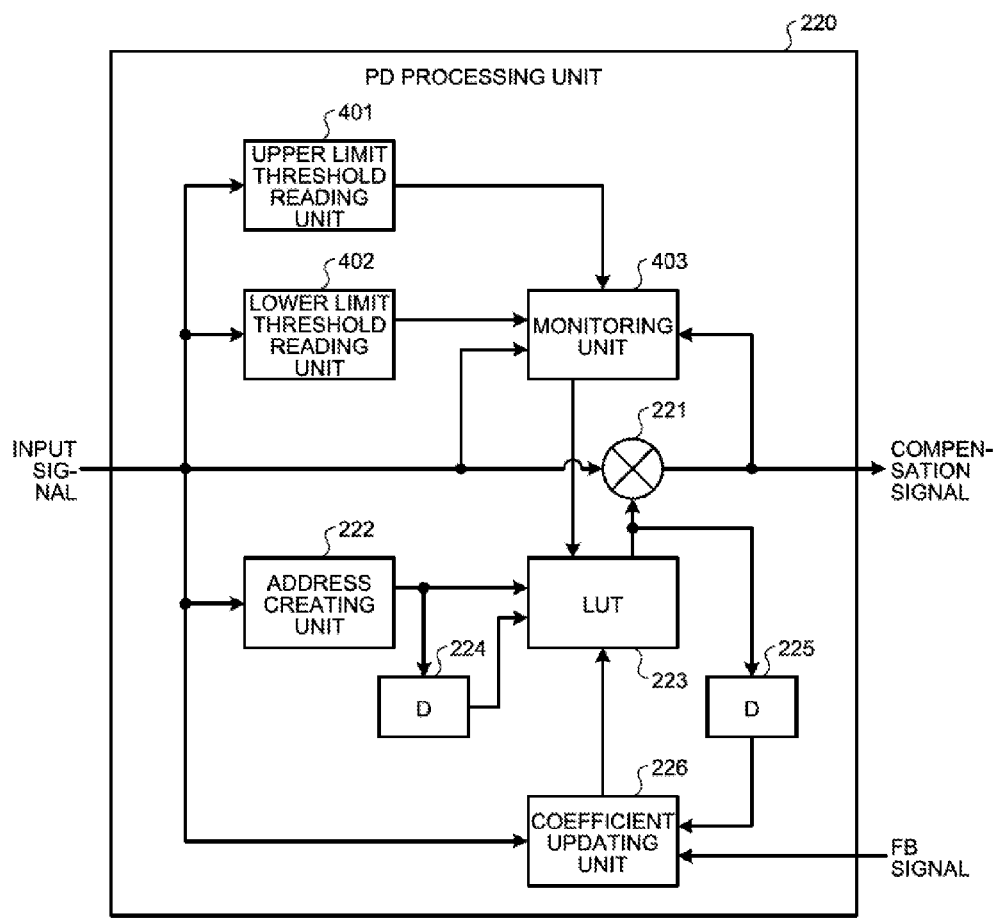
FIG. 5 is a block diagram illustrating the configuration of a PD processing unit according to a second embodiment.

FIG. 5 is a block diagram illustrating the configuration of the PD processing unit 220 according to a second embodiment. In FIG. 5, components that are the same as those illustrated in FIG. 2 are assigned the same reference numerals and descriptions thereof will be omitted. The PD processing unit 220 illustrated in FIG. 5 includes, instead of the upper limit threshold reading unit 301, the lower limit threshold reading unit 302, and the monitoring unit 303 included in the PD processing unit 220 illustrated in FIG. 2, an upper limit threshold reading unit 401, a lower limit threshold reading unit 402, and a monitoring unit 403.

The upper limit threshold reading unit 401 reads the upper limit thresholds associated with the electrical power of the input signal from a memory (not illustrated) or the like. Namely, the upper limit threshold reading unit 401 reads, from the memory or the like, the upper limit allowed for the electrical power ratios, which correspond to the monitoring target, of the input signal and the compensation signal. The upper limit threshold reading unit 401 sets the read upper limit thresholds in the monitoring unit 403.

The lower limit threshold reading unit 402 reads the lower limit thresholds associated with the electrical power of the input signal from a memory (not illustrated) or the like. Namely, the lower limit threshold reading unit 302 reads, from the memory or the like, the lower limit allowed for the electrical power ratios, which correspond to the monitoring target, of the input signal and the compensation signal. The lower limit threshold reading unit 402 sets the read lower limit thresholds in the monitoring unit 403.

The monitoring unit 403 calculates, from the electrical power of the input signal and the compensation signal, the input/output ratios of the distortion compensation unit 221 and determines whether the input/output ratios are included in the allowable ranges specified by the upper limit thresholds and the lower limit thresholds. Then, if the input/output ratios of the distortion compensation unit 221 are not included in the allowable ranges specified by the upper limit thresholds and the lower limit thresholds, the monitoring unit 403 determines that an abnormality has occurred in the distortion compensation and then initializes the LUT 223.

In the second embodiment, the input/output ratios of the distortion compensation unit 221 correspond to the monitoring target and it is monitored whether the input/output ratios are included in the allowable ranges specified by the thresholds. At this time, the upper limit threshold reading unit 401 and the lower limit threshold reading unit 402 read, from a memory (not illustrated) or the like, the upper limit thresholds and the lower limit thresholds that are different in accordance with the electrical power of the input signal. Specifically, for example, as illustrated in FIG. 6, the upper limit thresholds and the lower limit thresholds that specify respective allowable ranges 451 to 458 that are different in each of the sections of the input electrical power.

Figure 6:
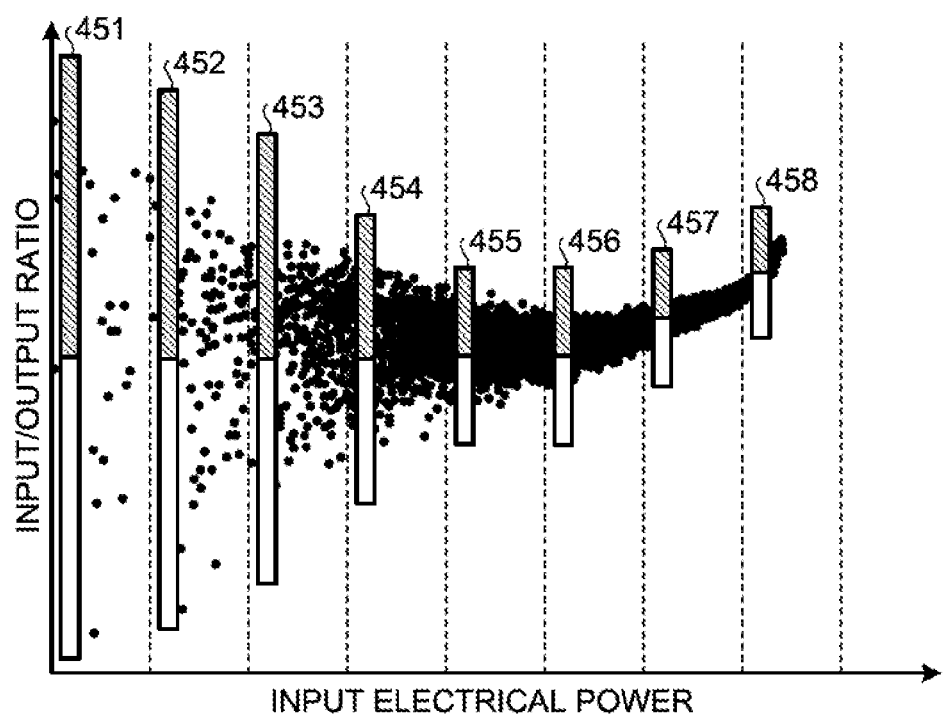
FIG. 6 is a schematic diagram illustrating a specific example of thresholds for each section according to the second embodiment.

In FIG. 6, the allowable ranges 451 to 458 of the input/output ratios in each of the sections are illustrated and the specific examples of the input/output ratios are plotted. Furthermore, in the allowable ranges 451 to 458, the ranges in each of which the upper limit threshold and the lower limit threshold are higher than the central value are indicated by the shaded bars and the ranges in each of which the upper limit threshold and the lower limit threshold are lower than the central value are indicated by the white bars. The width of each of the allowable ranges 451 to 458 in each of the sections is specified by the upper limit thresholds and the lower limit thresholds.

As illustrated in FIG. 6, in the sections in each of which the electrical power of the input signal is relatively low, the width of the allowable ranges is smaller as the electrical power of the input signal is as the electrical power of the input signal is increased. In other words, in the sections in each of which the input electrical power is equal to or less than the predetermined electrical power, for example, as indicated by the allowable ranges 451 to 455, the width of the allowable ranges is greater as the electrical power of the input signal is decreased and these sections are included in the allowable ranges specified by the thresholds even if the input/output ratios vary.

In this way, the reason that the width of the allowable ranges is great in the sections in each of which the electrical power of the input signal is low is as follows. Namely, if the electrical power of the input signal is low, the influence of the memory effect in the electrical power amplifier 250 tends to be large and the accuracy of the update of the distortion compensation coefficients in the coefficient updating unit 226 is not so high. Consequently, the input/output ratios of the distortion compensation unit 221 that is the electrical power ratios of the input signal and the compensation signal greatly vary. In this way, large variations in the input/output ratios is not caused by, for example, an abnormality, such as a failure of a circuit, but is caused by the memory effect in the electrical power amplifier 250; therefore, in the sections in each of which the electrical power of the input signal is low, the allowable ranges are set to high.

In contrast, in the sections in each of which the electrical power of the input signal is relatively high, compared with the other sections, both the upper limit thresholds and the lower limit thresholds are shifted to the high side. In other words, for example, in FIG. 6, in the sections in each of which the input electrical power is equal to or less than the predetermined electrical power, for example, as indicated by the allowable ranges 451 to 456, the central value of the upper limit thresholds and the lower limit thresholds are substantially the same, whereas, in the sections in each of which the input electrical power exceeds the predetermined electrical power, for example, as indicated by the allowable ranges 457 and 458, the central values of the upper limit thresholds and the lower limit thresholds become gradually high.

In this way, the reason that the allowable ranges are shifted to the high side in the sections in each of which the electrical power of the input signal is high is as follows. Namely, if the electrical power of the input signal is high, the electrical power amplifier 250 is operated in the vicinity of the saturation region and the nonlinear distortion becomes large. Consequently, if the electrical power of the input signal is high, the distortion compensation coefficients having the inverse characteristic of the nonlinear distortion also become large, the electrical power of the compensation signal with respect to the input signal becomes accordingly high, and thus the input/output ratios are shifted to the high side. In this way, the shift of the input/output ratios to the high side is not caused by, for example, an abnormality, such as a failure of a circuit, but is caused by the nonlinearity of the electrical power amplifier 250; therefore, in the sections in each of which the electrical power of the input signal is high, the upper limit thresholds and the lower limit thresholds are shifted to the side higher than the other sections.

Figure 7:
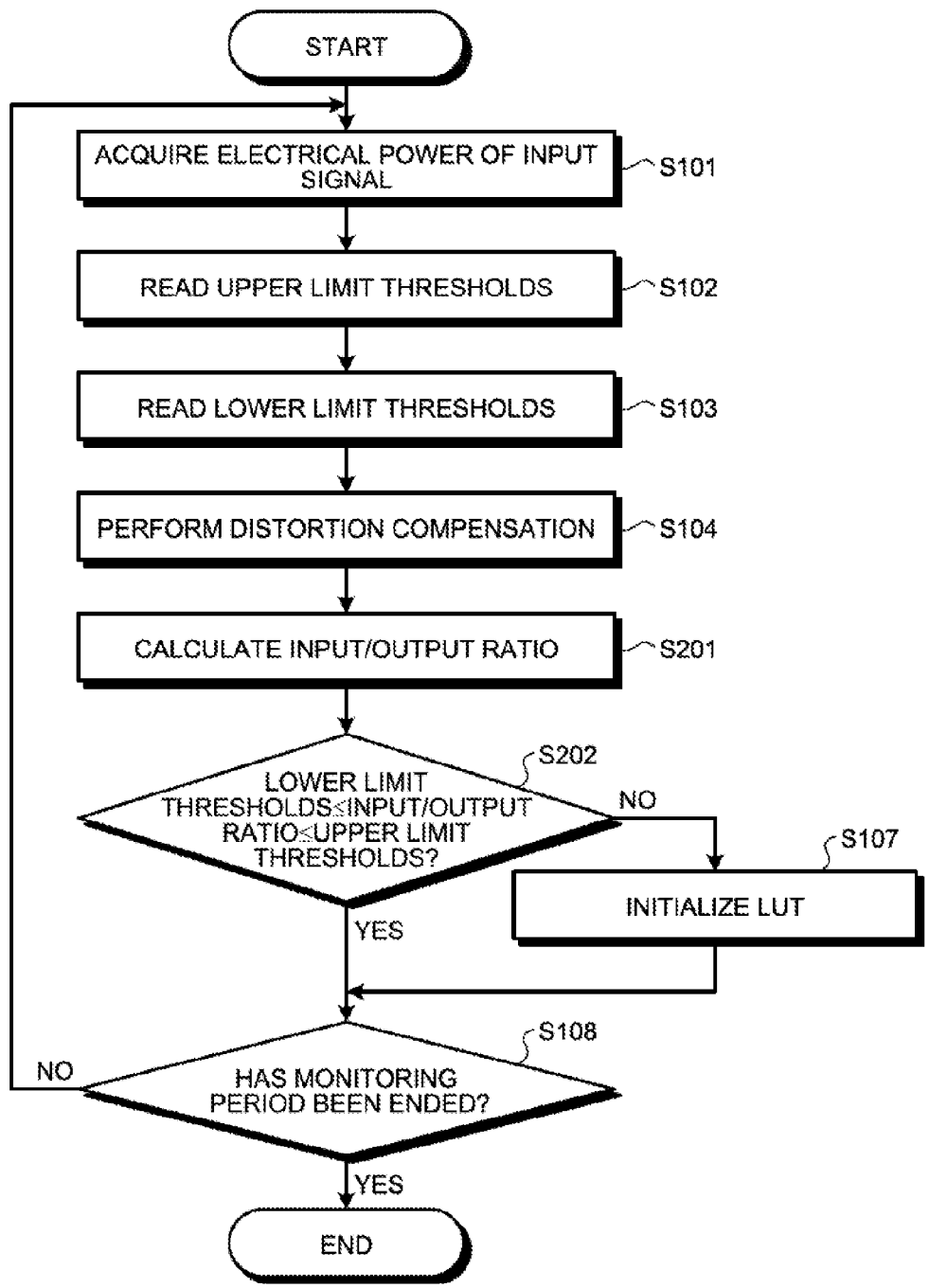
FIG. 7 is a flowchart illustrating the flow of a monitoring process according to the second embodiment.

In the following, the monitoring process of the distortion compensation performed by the PD processing unit 220 configured described above will be described with reference to the flowchart illustrated in FIG. 7. In FIG. 7, the components having the same configuration as those illustrated in FIG. 4 are assigned the same reference numerals and descriptions thereof in detail will be omitted.

If an input signal is input to the PD processing unit 220, the electrical power of the input signal is acquired by the upper limit threshold reading unit 401 and the lower limit threshold reading unit 402 (Step S101). Then, the upper limit thresholds associated with the electrical power of the input signal are read from a memory (not illustrated) by the upper limit threshold reading unit 401 (Step S102). Similarly, the lower limit thresholds associated with the electrical power of the input signal are read from a memory (not illustrated) by the lower limit threshold reading unit 402 (Step S103). The upper limit thresholds and the lower limit thresholds specify the allowable ranges of the input/output ratios of the distortion compensation unit 221 that correspond to the monitoring target monitored by the monitoring unit 403. The read upper limit threshold and the lower limit threshold are set in the monitoring unit 403.

In contrast, the input signal is also input to the distortion compensation unit 221 and the address creating unit 222 and the distortion compensation is performed (Step S104). Because the distortion compensation is performed, the compensation signal is output from the distortion compensation unit 221.

In the second embodiment, because the input/output ratios of the distortion compensation unit 221 correspond to the monitoring target, the input/output ratios of the distortion compensation unit 221 are calculated, by the monitoring unit 403, from the electrical power of the input signal and the compensation signal (Step S201). Then, it is determined, by the monitoring unit 403, whether the input/output ratios of the distortion compensation unit 221 are included in the allowable ranges specified by the upper limit thresholds and the lower limit thresholds (Step S202). If the result of this determination indicates that the input/output ratios are included in the allowable ranges (Yes at Step S202), it is determined that no abnormality occurs in the distortion compensation and the process is continued. In contrast, if the input/output ratios are not included in the allowable ranges (No at Step S202), it is determined that an abnormality has occurred in the distortion compensation and the action with respect to the abnormality is taken. Specifically, for example, the LUT 223 is initialized by the monitoring unit 403 (Step S107) and all of the distortion compensation coefficients stored in the LUT 223 are changed to the initial values.

Because such monitoring of the distortion compensation is performed in the predetermined monitoring period, it is determined, by the monitoring unit 403, whether the monitoring period has been ended (Step S108) and, if the monitoring period continues (No at Step S108), the monitoring process described above is repeated. Then, if the monitoring period has been ended (Yes at Step S108), the monitoring process is ended.

As described above, according to the embodiment, in accordance with the electrical power of the input signal, the upper limit thresholds and the lower limit thresholds of the input/output ratios, which are the monitoring target, of the distortion compensation unit are set and it is monitored whether the input/output ratios are included in the allowable ranges. Furthermore, the upper limit thresholds and the lower limit thresholds in accordance with the electrical power of the input signal increase, in the sections in each of which the electrical power of the input signal is low, the width of the allowable range and shift, in the sections in each of which the electrical power of the input signal is high, the allowable ranges to the high side. Consequently, it is possible to set, for each electrical power of the input signal, the allowable ranges by taking into consideration the memory effect and the nonlinearity of the electrical power amplifier and it is possible to accurately detect an abnormality of the distortion compensation.

[c] Third Embodiment

The characteristic of a third embodiment is that the monitoring target is set to the distortion compensation coefficients that are used for the distortion compensation.

The configuration of a radio base station system according to the third embodiment is the same as that described in the first embodiment (FIG. 1); therefore, descriptions thereof will be omitted. In the third embodiment, the configuration of the PD processing unit 220 is different from that described in the first embodiment.

Figure 8:
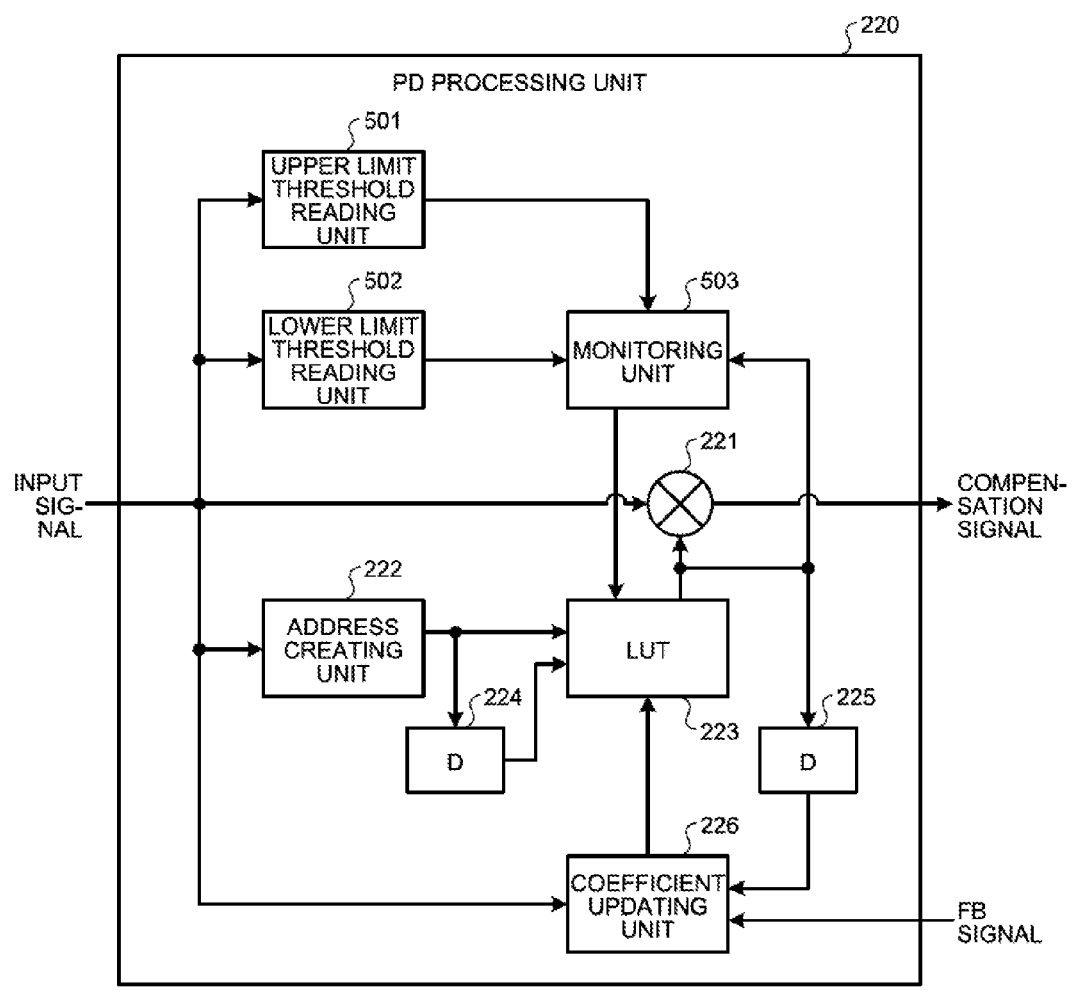
FIG. 8 is a block diagram illustrating the configuration of a PD processing unit according to a third embodiment.

FIG. 8 is a block diagram illustrating the configuration of the PD processing unit 220 according to a third embodiment. In FIG. 8, components that are the same as those illustrated in FIG. 2 are assigned the same reference numerals and descriptions thereof will be omitted. The PD processing unit 220 illustrated in FIG. 8 includes, instead of the upper limit threshold reading unit 301, the lower limit threshold reading unit 302, and the monitoring unit 303 included in the PD processing unit 220 illustrated in FIG. 2, an upper limit threshold reading unit 501, a lower limit threshold reading unit 502, and a monitoring unit 503.

The upper limit threshold reading unit 501 reads the upper limit thresholds associated with the electrical power of the input signal from a memory (not illustrated) or the like. Namely, the upper limit threshold reading unit 501 reads, from the memory or the like, the upper limit allowed for the distortion compensation coefficients that correspond to the monitoring target. The upper limit threshold reading unit 501 sets the read upper limit thresholds in the monitoring unit 503.

The lower limit threshold reading unit 502 reads the lower limit thresholds associated with the electrical power of the input signal from a memory (not illustrated) or the like. Namely, the lower limit threshold reading unit 502 reads, from the memory or the like, the lower limit allowed for the distortion compensation coefficients that correspond to the monitoring target. The lower limit threshold reading unit 502 sets the read lower limit thresholds in the monitoring unit 503.

The monitoring unit 503 acquires the distortion compensation coefficients that are output from the LUT 223 to the distortion compensation unit 221 and that are used for the distortion compensation and then determines whether the distortion compensation coefficients are included in the allowable ranges specified by the upper limit thresholds and the lower limit thresholds. Then, if the distortion compensation coefficients are not included in the allowable ranges specified by the upper limit thresholds and the lower limit thresholds, the monitoring unit 503 determines that an abnormality has occurred in the distortion compensation and initializes the LUT 223.

In the third embodiment, the distortion compensation coefficients that are used for the distortion compensation correspond to the monitoring target and it is monitored whether the distortion compensation coefficients are included in the allowable ranges specified by the thresholds. At this time, the upper limit threshold reading unit 501 and the lower limit threshold reading unit 502 read, from a memory (not illustrated) or the like, upper limit thresholds and the lower limit thresholds that are different in accordance with the electrical power of the input signal. Specifically, for example, as illustrated in FIG. 9, upper limit thresholds and the lower limit thresholds that specify an allowable ranges 551 to 558 that are different in each section of the input electrical power.

Figure 9:
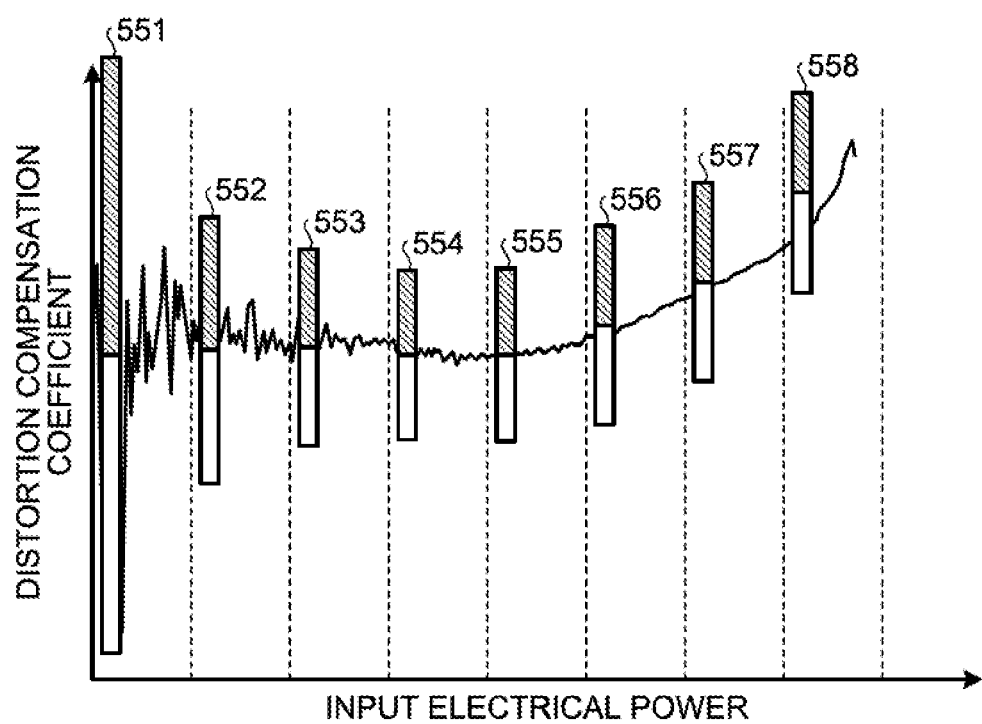
FIG. 9 is a schematic diagram illustrating a specific example of thresholds for each section according to the third embodiment.

In FIG. 9, the allowable ranges 551 to 558 of the distortion compensation coefficients in each of the sections are illustrated and the specific examples of the distortion compensation coefficients are indicated by a graph. Furthermore, in the allowable ranges 551 to 558, the ranges in each of which the upper limit threshold and the lower limit threshold are higher than the central value are indicated by the shaded bars and the ranges in each of which the upper limit threshold and the lower limit threshold are lower than the central value are indicated by the white bars. The width of each of the allowable ranges 551 to 558 in each of the sections is specified by the upper limit threshold and the lower limit threshold.

As illustrated in FIG. 9, in the sections in each of which the electrical power of the input signal is relatively low, the width of the allowable ranges is smaller as the electrical power of the input signal is increased. In other words, in the sections in each of which the input electrical power is equal to or less than the predetermined electrical power, for example, as indicated by the allowable ranges 551 to 555, the width of the allowable ranges is greater as the electrical power of the input signal is decreased and these sections are included in the allowable ranges specified by the thresholds even if the distortion compensation coefficients vary.

In this way, the reason that the width of the allowable ranges is great in the sections in each of which the electrical power of the input signal is low is as follows. Namely, if the electrical power of the input signal is low, the influence of the memory effect in the electrical power amplifier 250 tends to be large and the accuracy of the update of the distortion compensation coefficients in the coefficient updating unit 226 is not so high. Consequently, the distortion compensation coefficients stored in the LUT 223 greatly vary. In this way, large variations in the distortion compensation coefficients is not caused by, for example, an abnormality, such as a failure of a circuit, but is caused by the memory effect in the electrical power amplifier 250; therefore, in the sections in each of which the electrical power of the input signal is low, the allowable ranges are set to high.

In contrast, in the sections in each of which the electrical power of the input signal is relatively high, compared with the other sections, both the upper limit threshold and the lower limit threshold are shifted to the high side. In other words, for example, in FIG. 9, in the sections in each of which the input electrical power is equal to or less than the predetermined electrical power, for example, as indicated by the allowable ranges 551 to 555, the central values of the upper limit thresholds and the lower limit thresholds are substantially the same, whereas, in the sections in each of which the input electrical power exceeds the predetermined electrical power, for example, as indicated by the allowable ranges 556 to 558, the central values of the upper limit thresholds and the lower limit thresholds are gradually high.

In this way, the reason that the allowable ranges are shifted to the high side in the sections in each of which the electrical power of the input signal is high is as follows. Namely, if the electrical power of the input signal is high, the electrical power amplifier 250 is operated in the vicinity of the saturation region and the nonlinear distortion becomes large. Consequently, if the electrical power of the input signal is high, the distortion compensation coefficients having the inverse characteristic of the nonlinear distortion also becomes large. In this way, an increase in the distortion compensation coefficients is not caused by, for example, an abnormality, such as a failure of a circuit, but is caused by the nonlinearity of the electrical power amplifier 250; therefore, in the sections in each of which the electrical power of the input signal is high, the upper limit thresholds and the lower limit thresholds are shifted to the side higher than the other sections.

Figure 10:
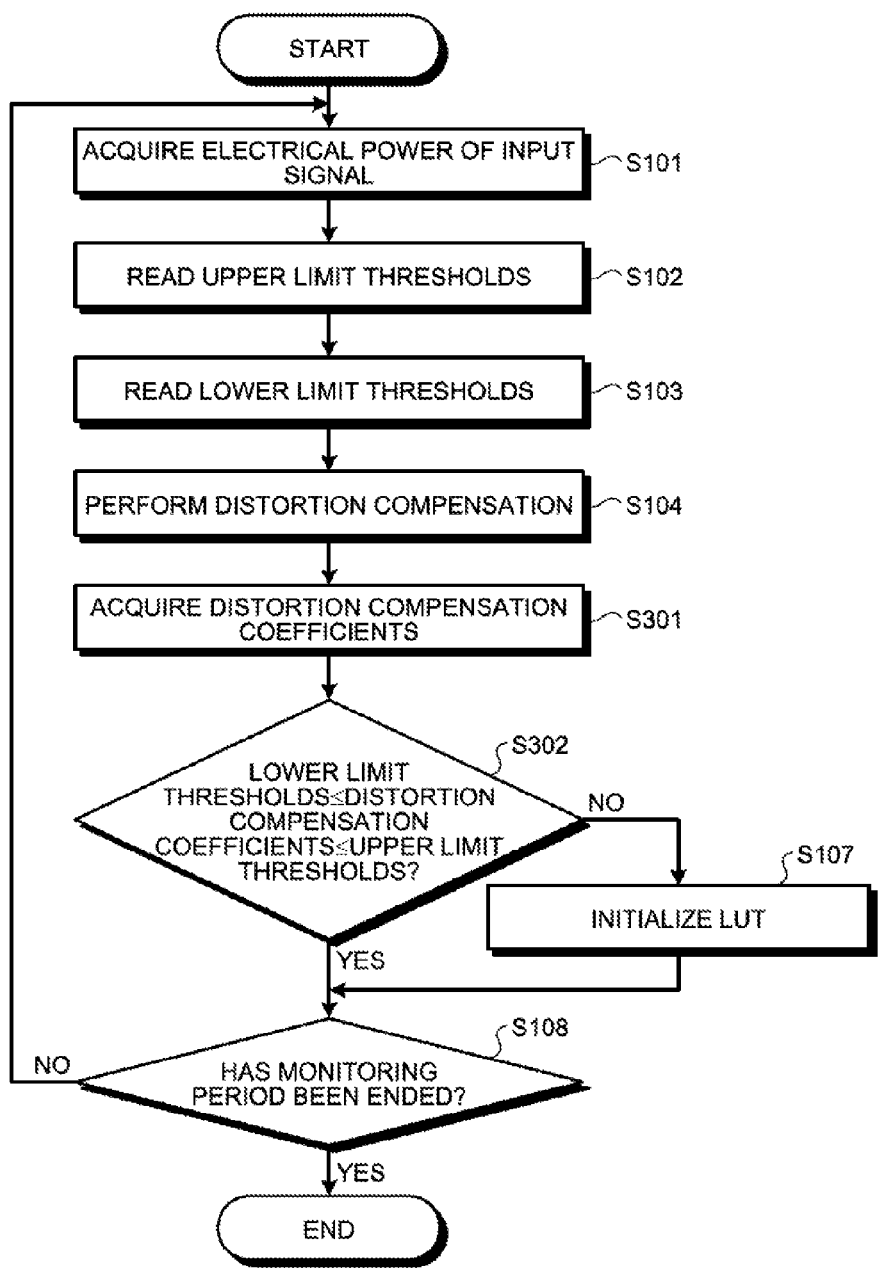
FIG. 10 is a flowchart illustrating the flow of a monitoring process according to the third embodiment.

In the following, the monitoring process of the distortion compensation performed by the PD processing unit 220 configured described above will be described with reference to the flowchart illustrated in FIG. 10. In FIG. 10, the components having the same configuration as those illustrated in FIG. 4 are assigned the same reference numerals and descriptions thereof in detail will be omitted.

If an input signal is input to the PD processing unit 220, the electrical power of the input signal is acquired by the upper limit threshold reading unit 501 and the lower limit threshold reading unit 502 (Step S101). Then, the upper limit thresholds associated with the electrical power of the input signal is read from a memory (not illustrated) by the upper limit threshold reading unit 501 (Step S102). Similarly, the lower limit thresholds associated with the electrical power of the input signal is read from a memory (not illustrated) by the lower limit threshold reading unit 502 (Step S103). The upper limit thresholds and the lower limit thresholds specify the allowable ranges of the distortion compensation coefficients that correspond to the monitoring target monitored by the monitoring unit 503. The read upper limit thresholds and the lower limit thresholds are set in the monitoring unit 503.

In contrast, the input signal is also input to the distortion compensation unit 221 and the address creating unit 222 and the distortion compensation is performed (Step S104). At this time, the distortion compensation coefficients stored in the addresses associated with the electrical power of the input signal are output from the LUT 223 to the distortion compensation unit 221.

In the third embodiment, because the distortion compensation coefficients used for the distortion compensation correspond to the monitoring target, the distortion compensation coefficients that are output to the distortion compensation unit 221 are acquired by the monitoring unit 503 (Step S301). Then, it is determined, by the monitoring unit 503, whether the distortion compensation coefficients are included in the allowable ranges specified by the upper limit thresholds and the lower limit thresholds (Step S302). If the result of this determination indicates that the distortion compensation coefficients are included in the allowable ranges (Yes at Step S302), it is determined that no abnormality occurs in the distortion compensation and the process is continued. In contrast, if the distortion compensation coefficients are not included in the allowable range (No at Step S302), it is determined that an abnormality has occurred in the distortion compensation and an action with respect to the abnormality is taken. Specifically, for example, the LUT 223 is initialized by the monitoring unit 503 (Step S107) and all of the distortion compensation coefficients stored in the LUT 223 are changed to the initial values.

Because such monitoring of the distortion compensation is performed in the predetermined monitoring period, it is determined, by the monitoring unit 503, whether the monitoring period has been ended (Step S108) and, if the monitoring period continues (No at Step S108), the monitoring process described above is repeated. Then, if the monitoring period has been ended (Yes at Step S108), the monitoring process is ended.

As described above, according to the embodiment, in accordance with the electrical power of the input signal, the upper limit thresholds and the lower limit thresholds of the distortion compensation coefficients that correspond to the monitoring target are set and it is monitored whether the distortion compensation coefficients used for the distortion compensation are included in the allowable ranges. Furthermore, the upper limit thresholds and the lower limit thresholds that are in accordance with the electrical power of the input signal increase, in the section in which the electrical power of the input signal is low, the width of the allowable ranges and shift, in the sections in each of which the electrical power of the input signal is high, the allowable ranges to the high side. Consequently, it is possible to set, for each electrical power of the input signal, the allowable ranges by taking into consideration the memory effect and the nonlinearity of the electrical power amplifier and it is possible to accurately detect an abnormality of the distortion compensation.

[d] Fourth Embodiment

The characteristic of a fourth embodiment is that the monitoring target is set to the updated distortion compensation coefficients.

The configuration of a radio base station system according to the fourth embodiment is the same as that described in the first embodiment (FIG. 1); therefore, descriptions thereof will be omitted. In the fourth embodiment, the configuration of the PD processing unit 220 is different from that described in the first embodiment.

Figure 11:
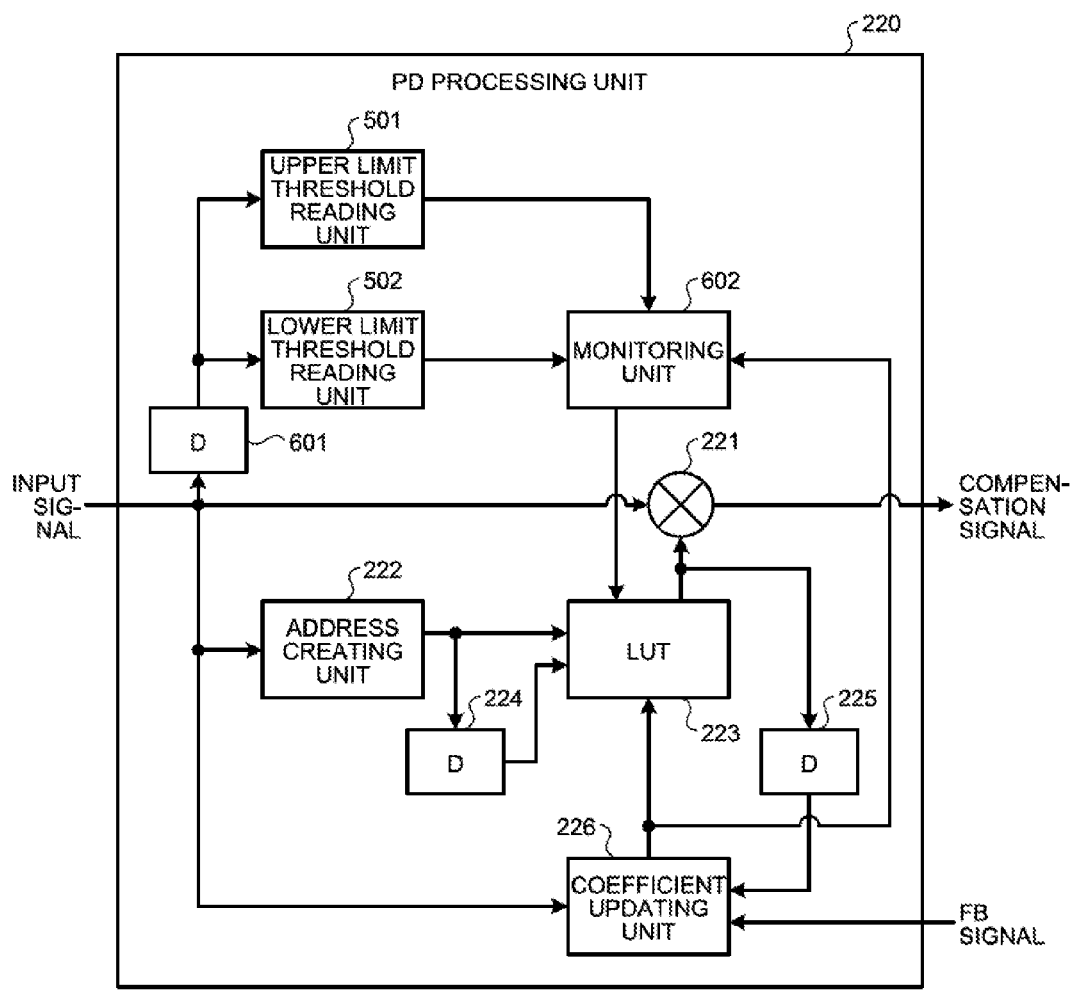
FIG. 11 is a block diagram illustrating the configuration of a PD processing unit according to a fourth embodiment.

FIG. 11 is a block diagram illustrating the configuration of the PD processing unit 220 according to a fourth embodiment. In FIG. 11, components that are the same as those illustrated in FIGS. 2 and 8 are assigned the same reference numerals and descriptions thereof will be omitted. The PD processing unit 220 illustrated in FIG. 11 has the configuration in which a delay device 601 is added to the PD processing unit 220 illustrated in FIG. 8 and a monitoring unit 602 is included instead of the monitoring unit 503.

The delay device 601 holds the electrical power of the input signal for the period of time corresponding to a processing delay of the FB signal until the FB signal is fed back to the PD processing unit 220. Then, the delay device 601 notifies the upper limit threshold reading unit 501 and the lower limit threshold reading unit 502 of the electrical power of the input signal held for the period of time corresponding to the processing delay. Consequently, in the fourth embodiment, the upper limit threshold reading unit 501 and the lower limit threshold reading unit 502 read, at the timing in which the FB signal is fed back to the PD processing unit 220, the upper limit thresholds and the lower limit thresholds in accordance with the electrical power of the input signal associated with the subject FB signal from a memory (not illustrated) or the like. Namely, the upper limit threshold reading unit 501 and the lower limit threshold reading unit 502 acquire the upper limit thresholds and the lower limit thresholds in accordance with the electrical power of the input signal that are used by the coefficient updating unit 226 to update the distortion compensation coefficients and then set the acquired thresholds in the monitoring unit 602.

The monitoring unit 602 acquires the distortion compensation coefficients that are updated by the coefficient updating unit 226 and written in the LUT 223 and determines whether the distortion compensation coefficients are included in the allowable ranges that are specified by the upper limit thresholds and the lower limit thresholds. Then, if the distortion compensation coefficients are not included in the allowable ranges that are specified by the upper limit thresholds and the lower limit thresholds, the monitoring unit 602 determines that an abnormality has occurred in the distortion compensation and initializes the LUT 223.

In the fourth embodiment, the distortion compensation coefficients correspond to the monitoring target; however, unlike the third embodiment, the updated distortion compensation coefficients that have been updated by the coefficient updating unit 226 correspond to the monitoring target. Consequently, if an abnormality is present in the distortion compensation, the abnormality can be detected before the distortion compensation coefficients are actually used by the distortion compensation unit 221. Consequently, it is possible to prevent the compensation signal that has been subjected to the distortion compensation by inappropriate distortion compensation coefficients from being output from the PD processing unit 220 and it is possible to prevent an increase in adjacent channel leakage electrical power, or the like.

Furthermore, also in the fourth embodiment, similarly to the third embodiment, the upper limit threshold reading unit 501 and the lower limit threshold reading unit 502 read, from a memory (not illustrated), or the like, the upper limit thresholds and the lower limit thresholds that are different in accordance with the electrical power of the input signal. Namely, the upper limit threshold reading unit 501 and the lower limit threshold reading unit 502 read the thresholds that increase, in the sections in each of which the input electrical power is equal to or less than the predetermined electrical power, the allowable ranges as the electrical power of the input signal is lower and that gradually shift, in the sections in each of which the input electrical power exceeds the predetermined electrical power, the allowable ranges.

Figure 12:
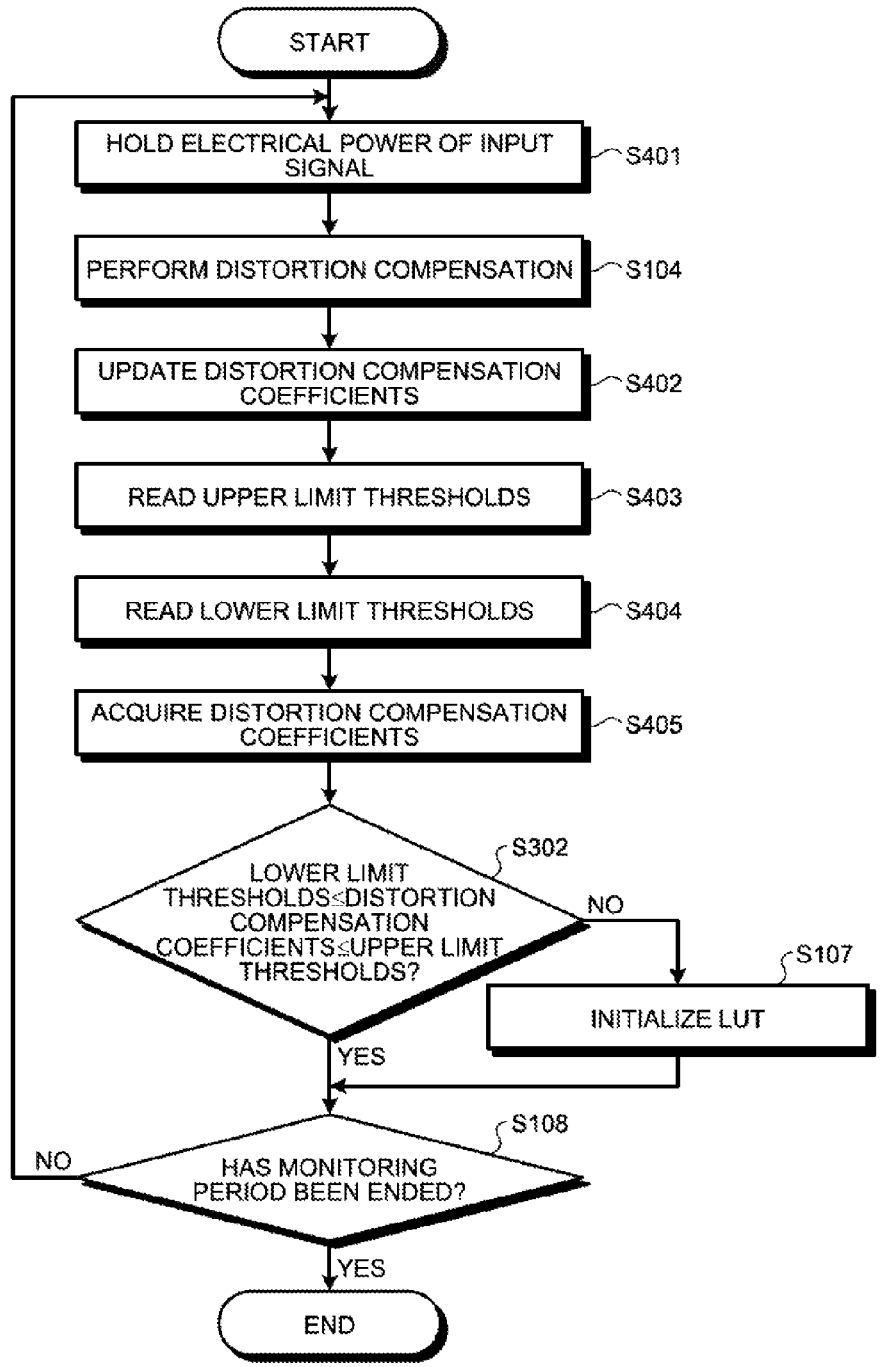
FIG. 12 is a flowchart illustrating the flow of a monitoring process according to the fourth embodiment.

In the following, a monitoring process of the distortion compensation performed by the PD processing unit 220 configured described above will be described with reference to the flowchart illustrated in FIG. 12. In FIG. 12, the components having the same configuration as those illustrated in FIGS. 4 and 10 are assigned the same reference numerals and descriptions thereof in detail will be omitted.

If an input signal is input to the PD processing unit 220, the electrical power of the input signal is temporarily held by the delay device 601 (Step S401). The electrical power of this input signal is notified to the upper limit threshold reading unit 501 and the lower limit threshold reading unit 502 after elapse of a period of time corresponding to the processing delay of the FB signal until the FB signal is fed back to the PD processing unit. In contrast, the input signal is also input to the distortion compensation unit 221 and the address creating unit 222 and the distortion compensation is performed (Step S104). The compensation signal obtained from the distortion compensation is output from the PD processing unit 220 to the DA converter 230 and is fed back via the up converter 240 and the electrical power amplifier 250. Then, the FB signal to be fed back is input to the PD processing unit 220 via the down converter 260 and the AD converter 270.

If the FB signal is input to the PD processing unit 220, the distortion compensation coefficients output form the delay device 225 by the coefficient updating unit 226 are updated (Step S402). Specifically, an amount of update is calculated by the coefficient updating unit 226 on the basis of the error between the input signal and the FB signal and the calculated amount of update is added to the distortion compensation coefficients that are output from the delay device 225. Consequently, the distortion compensation coefficients are updated such that an error between the input signal and the FB signal is small. Then, the updated distortion compensation coefficients are written in the addresses that are stored in the LUT 223 and that are delayed by the delay device 224.

At the same timing as the update of the distortion compensation coefficients described above, the upper limit thresholds associated with the electrical power of the input signal notified by the delay device 601 are read by the upper limit threshold reading unit 501 from a memory (not illustrated), or the like (Step S403). Similarly, the lower limit thresholds associated with the electrical power of the input signal notified by the delay device 601 are read by the lower limit threshold reading unit 502 from a memory (not illustrated), or the like (Step S404). The upper limit thresholds and the lower limit thresholds specify the allowable ranges of the updated distortion compensation coefficients that are the monitoring target monitored by the monitoring unit 602. The read upper limit thresholds and the read lower limit thresholds are set in the monitoring unit 602. Consequently, the upper limit thresholds and the lower limit thresholds that are in accordance with the electrical power of the input signal associated with the distortion compensation coefficients updated by the coefficient updating unit 226 are set in the monitoring unit 602.

Thus, the updated distortion compensation coefficients to be written by the monitoring unit 602 from the coefficient updating unit 226 into the LUT 223 are acquired (Step S405). Then, it is determined, by the monitoring unit 602, whether the distortion compensation coefficients are included in the allowable ranges specified by the upper limit thresholds and the lower limit thresholds (Step S302). If the result of this determination indicates that the distortion compensation coefficients are included in the allowable ranges (Yes at Step S302), it is determined that no abnormality occurs in the distortion compensation and the process is continued. In contrast, if the distortion compensation coefficients are not included in the allowable ranges (No at Step S302), it is determined that an abnormality has occurred in the distortion compensation and an action with respect to the abnormality is taken. Specifically, the LUT 223 is initialized by, for example, the monitoring unit 602 (Step S107) and all of the distortion compensation coefficients stored in the LUT 223 are changed to the initial values.

Because such monitoring of the distortion compensation is performed in the predetermined monitoring period, it is determined, by the monitoring unit 602, whether the monitoring period has been ended (Step S108) and, if the monitoring period continues (No at Step S108), the monitoring process described above is repeated. Then, if the monitoring period has been ended (Yes at Step S108), the monitoring process is ended.

As described above, according to the embodiment, in accordance with the electrical power of the input signal, the upper limit thresholds and the lower limit thresholds of the distortion compensation coefficients that correspond to the monitoring target are set and it is monitored whether the updated distortion compensation coefficients are included in the allowable ranges. Furthermore, the upper limit thresholds and the lower limit thresholds that are in accordance with the electrical power of the input signal increase, in the sections in each of which the electrical power of the input signal is low, the width of the allowable range and shift, in the sections in each of which the electrical power of the input signal is high, the allowable ranges to the high side. Consequently, it is possible to set, for each electrical power of the input signal, the allowable ranges by taking into consideration the memory effect and the nonlinearity of the electrical power amplifier and it is possible to accurately detect an abnormality of the distortion compensation.

[e] Fifth Embodiment

The characteristic of a fifth embodiment is that the number of times the electrical power of the compensation signal that correspond to the monitoring target is not included in the allowable ranges is counted and, if the number of counted times reaches the number of settings, the occurrence of an abnormality in the distortion compensation is detected.

The configuration of a radio base station system according to the fifth embodiment is the same as that described in the first embodiment (FIG. 1); therefore, descriptions thereof will be omitted. In the fifth embodiment, the configuration of the PD processing unit 220 is different from that described in the first embodiment.

Figure 13:
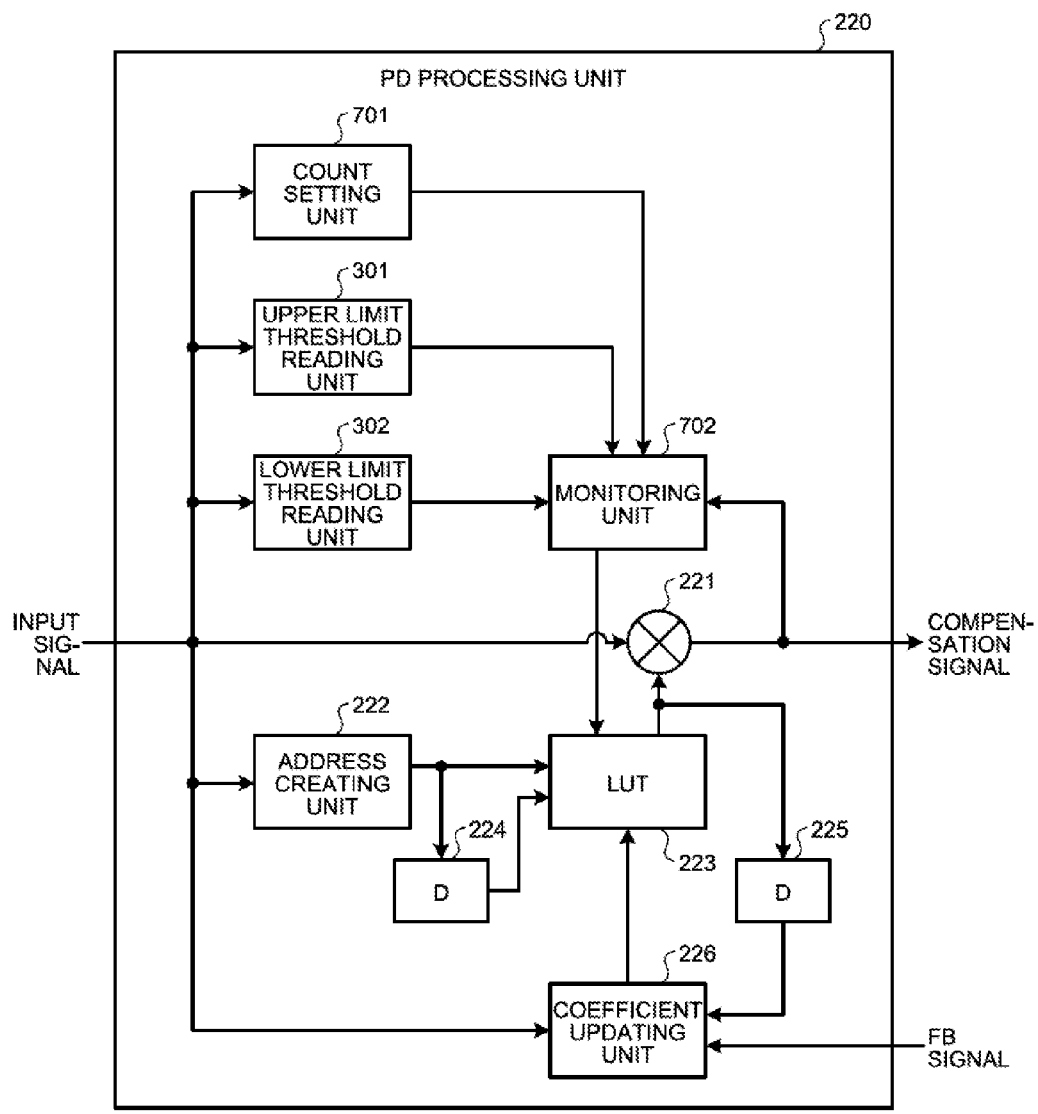
FIG. 13 is a block diagram illustrating the configuration of a PD processing unit according to a fifth embodiment.

FIG. 13 is a block diagram illustrating the configuration of the PD processing unit 220 according to a fifth embodiment. In FIG. 13, components that are the same as those illustrated in FIG. 2 are assigned the same reference numerals and descriptions thereof will be omitted. The PD processing unit 220 illustrated in FIG. 13 has the configuration in which a count setting unit 701 is added to the PD processing unit 220 illustrated in FIG. 2 and a monitoring unit 702 is included instead of the monitoring unit 303.

The count setting unit 701 acquires the electrical power of the input signal and decides, on the basis of the electrical power of the input signal, the number of times that the electrical power of the compensation signal is not included in the allowable ranges and that is used to determine the occurrence of an abnormality. Namely, the count setting unit 701 sets, in the monitoring unit 702, the number of times that corresponds to a threshold of the number of deviations that the monitoring target deviates the allowable range. The electrical power of the compensation signal corresponding to the monitoring target varies when the electrical power of the input signal is relatively low caused by the memory effect in the electrical power amplifier 250. Consequently, for example, the count setting unit 701 increases the number of counts to be set in the monitoring unit 702 as the electrical power of the input signal is lower such that the occurrence of the abnormality is not detected until the number of deviations of the electrical power of the compensation signal is increased. Consequently, it is possible to reduce the possibility that an abnormality of the distortion compensation is erroneously detected due to the variation caused by the memory effect.

The monitoring unit 702 acquires the electrical power of the compensation signal output from the distortion compensation unit 221 and determines whether the electrical power of the compensation signal is included in the allowable ranges specified by the upper limit thresholds and the lower limit thresholds. Then, the monitoring unit 702 counts the number of deviations that the electrical power of the compensation signal is not included in the allowable ranges specified by the upper limit thresholds and the lower limit thresholds; determines, if the number of counted deviations reaches the number of settings, that an abnormality has occurred in the distortion compensation; and initializes the LUT 223.

Figure 14:
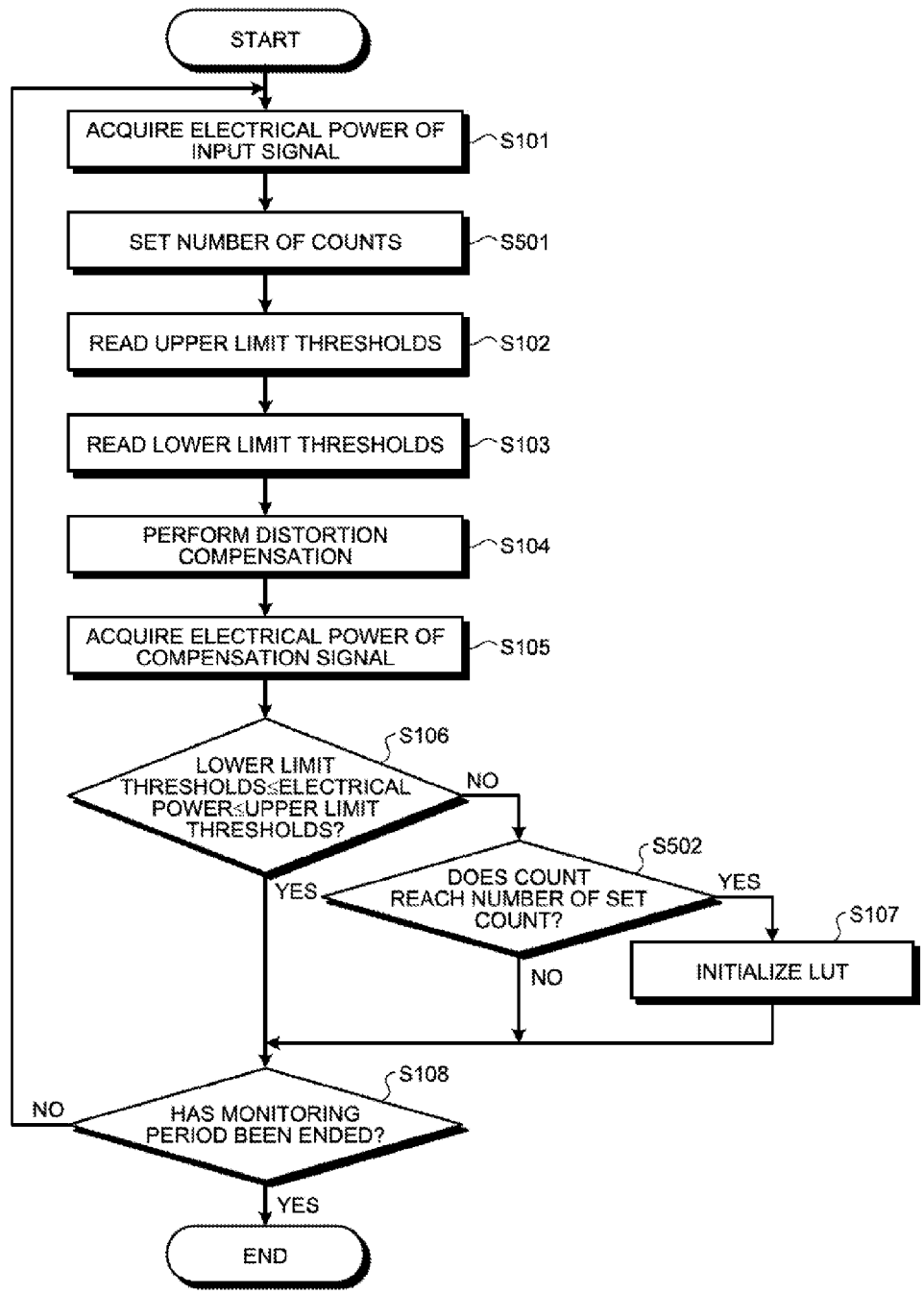
FIG. 14 is a flowchart illustrating the flow of a monitoring process according to the fifth embodiment.

In the following, a monitoring process of the distortion compensation performed by the PD processing unit 220 configured described above will be described with reference to the flowchart illustrated in FIG. 14. In FIG. 14, the components having the same configuration as those illustrated in FIG. 4 are assigned the same reference numerals and descriptions thereof in detail will be omitted.

When an input signal is input to the PD processing unit 220, the electrical power of the input signal is acquired by the upper limit threshold reading unit 301 and the lower limit threshold reading unit 302 (Step S101). Furthermore, the electrical power of the input signal is also acquired by the count setting unit 701 and the number of counts having a larger number is set in the monitoring unit 702 as, for example, the electrical power of the input signal is lower (Step S501). The number of settings mentioned here is the number of counts that is used to determine that an abnormality has occurred in the distortion compensation and it is determined, if the number of deviations that the electrical power of the compensation signal is not included in the allowable ranges reaches the number of settings, that an abnormality has occurred in the distortion compensation.

Then, the upper limit thresholds associated with the electrical power of the input signal are read by the upper limit threshold reading unit 301 from a memory (not illustrated) or the like (Step S102). Similarly, the lower limit thresholds associated with the electrical power of the input signal are read by the lower limit threshold reading unit 302 from a memory (not illustrated) or the like (Step S103). The upper limit thresholds and the lower limit thresholds specify the allowable ranges of the electrical power of the compensation signal that corresponds to the monitoring target monitored by the monitoring unit 702. The read upper limit thresholds and the lower limit thresholds are set in the monitoring unit 702.

In contrast, the input signal is also input to the distortion compensation unit 221 and the address creating unit 222 and then the distortion compensation is performed (Step S104). Then, the electrical power of the compensation signal is acquired by the monitoring unit 702 (Step S105) and it is determined whether the electrical power of the compensation signal is included in the allowable ranges specified by the upper limit thresholds and the lower limit thresholds (Step S106). If the result of this determination indicates that the electrical power of the compensation signal is included in the allowable ranges (Yes at Step S106), it is determined that no abnormality occurs in the distortion compensation and the process is continued.

Furthermore, if the electrical power of the compensation signal is not included in the allowable ranges (No at Step S106), it is determined whether the number of deviations the electrical power of the compensation signal is not included in the allowable ranges reaches the number of settings (Step S502). If the result of this determination indicates that the number of deviations does not reach the number of settings (No at Step S502), it is determined that no abnormality occurs in the distortion compensation and the process is continued. In contrast, if the number of deviations reaches the number of settings (Yes at Step S502), it is determined that an abnormality has occurred in the distortion compensation and an action with respect to the abnormality is taken. Specifically, the LUT 223 is initialized by, for example, the monitoring unit 303 (Step S107) and all of the distortion compensation coefficients stored in the LUT 223 are changed to the initial values.

Because such monitoring of the distortion compensation is performed in the predetermined monitoring period, it is determined, by the monitoring unit 303, whether the monitoring period has been ended (Step S108) and, if the monitoring period continues (No at Step S108), the monitoring process described above is repeated. Then, if the monitoring period has been ended (Yes at Step S108), the monitoring process is ended.

As described above, according to the embodiment, in accordance with the electrical power of the input signal, the upper limit thresholds and the lower limit thresholds of the electrical power of the compensation signal that corresponds to the monitoring target are set and it is monitored whether the electrical power of the compensation signal is included in the allowable ranges. Then, if the number of deviations that is not included in the allowable ranges reaches the number of settings in accordance with the electrical power of the input signal, it is determined that an abnormality has occurred in the distortion compensation. Consequently, for example, even if the variation in the monitoring target becomes large due to the memory effect in the electrical power amplifier, it is not determined, without careful consideration, that an abnormality has occurred and the abnormality of the distortion compensation can be detected with high accuracy.

Furthermore, in the fifth embodiment described above, the number of settings is different in accordance with the electrical power of the input signal; however, the number of settings may also be constant irrespective of the electrical power of the input signal. Namely, if the number of deviations the electrical power of the compensation signal corresponding to the monitoring target is not included in the allowable ranges reaches the predetermined number of settings, it may also be possible to determine that an abnormality has occurred in the distortion compensation.

[f] Sixth Embodiment

The characteristic of a sixth embodiment is that, instead of the electrical power of the input signal, a threshold associated with the address that is used to read a distortion compensation coefficient is read and the electrical power of the compensation signal that corresponds to the monitoring target is monitored.

The configuration of a radio base station system according to the sixth embodiment is the same as that described in the first embodiment (FIG. 1); therefore, descriptions thereof will be omitted. In the sixth embodiment, the configuration of the PD processing unit 220 is different from that described in the first embodiment.

Figure 15:
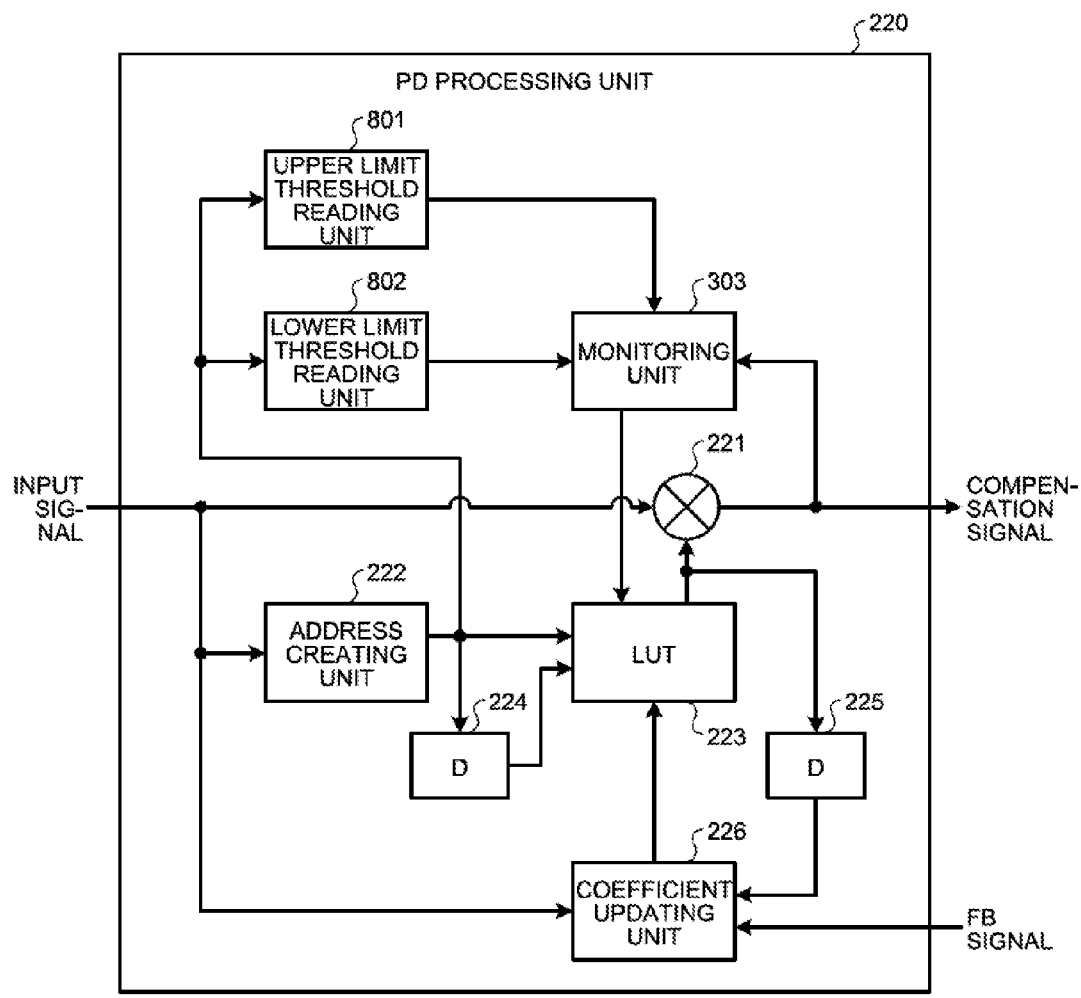
FIG. 15 is a block diagram illustrating the configuration of a PD processing unit according to a sixth embodiment.

FIG. 15 is a block diagram illustrating the configuration of the PD processing unit 220 according to a sixth embodiment. In FIG. 15, components that are the same as those illustrated in FIG. 2 are assigned the same reference numerals and descriptions thereof will be omitted. The PD processing unit 220 illustrated in FIG. 15 includes, instead of the upper limit threshold reading unit 301 and the lower limit threshold reading unit 302 included in the PD processing unit 220 illustrated in FIG. 2, an upper limit threshold reading unit 801 and a lower limit threshold reading unit 802.

The upper limit threshold reading unit 801 acquires the addresses created by the address creating unit 222 and reads the upper limit thresholds associated with the addresses from a memory (not illustrated), or the like. Namely, the upper limit threshold reading unit 801 reads, from a memory (not illustrated), or the like, the upper limit thresholds associated with the addresses created on the basis of the addresses of the input signal from a memory or the like. The upper limit threshold reading unit 801 sets the read upper limit thresholds in the monitoring unit 303.

The lower limit threshold reading unit 802 acquires the addresses created by the address creating unit 222 and reads the lower limit thresholds associated with the addresses from a memory (not illustrated) or the like. Namely, the lower limit threshold reading unit 802 reads the lower limit thresholds associated with the addresses created on the basis of the electrical power of the input signal from a memory, or the like. The lower limit threshold reading unit 802 sets the read lower limit thresholds in the monitoring unit 303.

In the sixth embodiment, instead of the thresholds associated with the electrical power of the input signal, the thresholds associated with the addresses are read. Because the address creating unit 222 creates the addresses on the basis of the electrical power of the input signal, the addresses reflect the electrical power of the input signal. Consequently, instead of the electrical power of the input signal, the upper limit thresholds and the lower limit thresholds can be determined by using the addresses.

Furthermore, in the sixth embodiment, the upper limit threshold reading unit 801 and the lower limit threshold reading unit 802 read, from a memory (not illustrated), or the like, the upper limit thresholds and the lower limit thresholds that are different in each of the sections of the addresses. Namely, the upper limit threshold reading unit 801 and the lower limit threshold reading unit 802 read the upper limit thresholds and the lower limit thresholds that increase, in the sections of the addresses associated with the low electrical power that is equal to or less than the predetermined electrical power, the width of the allowable ranges as the electrical power is lower and that shift, in the sections of the addresses associated with the high electrical power that exceeds the predetermined electrical power, the allowable ranges to the high side.

Figure 16:
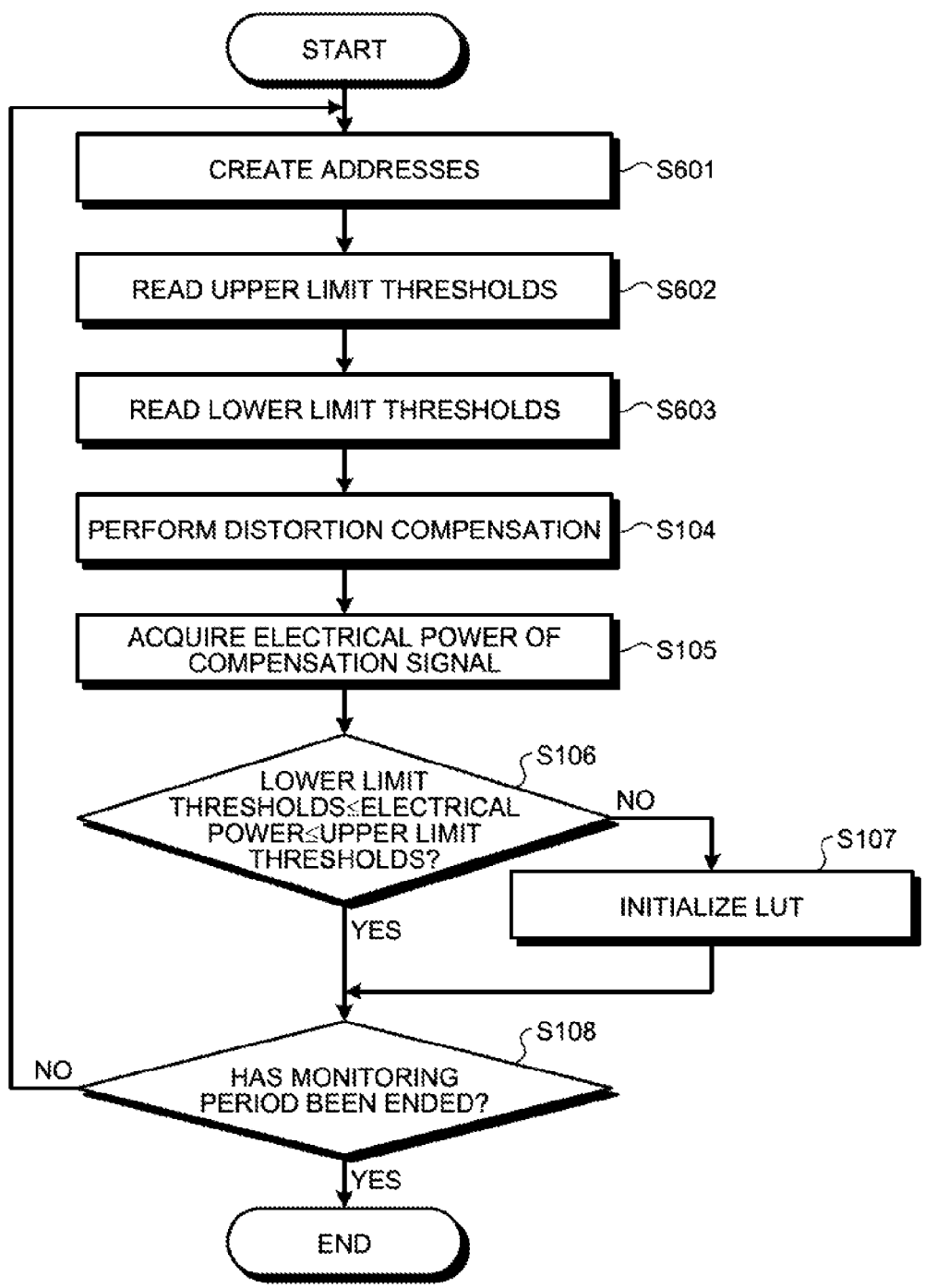
FIG. 16 is a flowchart illustrating the flow of a monitoring process according to the sixth embodiment.

In the following, a monitoring process of the distortion compensation performed by the PD processing unit 220 configured described above will be described with reference to the flowchart illustrated in FIG. 16. In FIG. 16, the components having the same configuration as those illustrated in FIG. 4 are assigned the same reference numerals and descriptions thereof in detail will be omitted.

When an input signal is input to the PD processing unit 220, the addresses on the basis of the electrical power of the input signal are created by the address creating unit 222 (Step S601). The created addresses are output to the LUT 223 and the distortion compensation coefficients stored in these addresses are output to the distortion compensation unit 221. Furthermore, the created addresses are also output to the upper limit threshold reading unit 801 and the lower limit threshold reading unit 802.

Then, The upper limit thresholds associated with the addresses are read by the upper limit threshold reading unit 801 from the memory (not illustrated), or the like (Step S602). Similarly, the lower limit thresholds associated with the addresses are read by the lower limit threshold reading unit 802 from the memory (not illustrated), or the like (Step S603). The upper limit thresholds and the lower limit thresholds specify the allowable ranges of the electrical power of the compensation signal that corresponds to the monitoring target monitored by the monitoring unit 303. The read upper limit thresholds and the lower limit thresholds are set in the monitoring unit 303.

In contrast, because the distortion compensation coefficients that are output from the LUT 223 to the distortion compensation unit 221 are used, the distortion compensation of the input signal is performed by the distortion compensation unit 221 (Step S104). Because the distortion compensation is performed, the compensation signal is output from the distortion compensation unit 221.

Then, the electrical power of the compensation signal is acquired by the monitoring unit 303 (Step S105) and it is determined whether the electrical power of the compensation signal are included in the allowable ranges specified by the upper limit thresholds and the lower limit thresholds (Step S106). If the result of this determination indicates that the electrical power of the compensation signal is included in the allowable ranges (Yes at Step S106), it is determines that no abnormality occurs in the distortion compensation and the process is continued. In contrast, if the electrical power of the compensation signal is not included in the allowable ranges (No at Step S106), it is determined that an abnormality has occurred in the distortion compensation and an action with respect to the abnormality is taken. Specifically, the LUT 223 is initialized by, for example, the monitoring unit 303 (Step S107) and all of the distortion compensation coefficients stored in the LUT 223 are changed to the initial values.

Because such monitoring of the distortion compensation is performed in the predetermined monitoring period, it is determined, by the monitoring unit 303, whether the monitoring period has been ended (Step S108) and, if the monitoring period continues (No at Step S108), the monitoring process described above is repeated. Then, if the monitoring period has been ended (Yes at Step S108), the monitoring process is ended.

As described above, according to the embodiment, in accordance with the addresses created on the basis of the electrical power of the input signal, the upper limit thresholds and the lower limit thresholds, which are the monitoring target, of the electrical power of the compensation signal are set and it is monitored whether the electrical power of the compensation signal is included in the allowable ranges. Furthermore, the upper limit thresholds and the lower limit thresholds in accordance with the addresses increase the width of the allowable ranges in the sections of the addresses associated with the low electrical power and shift the allowable ranges to the high side in the sections of the addresses associated with the high electrical power. Consequently, it is possible to set, for each of the addresses, the allowable ranges by taking into consideration the memory effect and the nonlinearity generated in the electrical power amplifier and it is possible to detect an abnormality of the distortion compensation with high accuracy.

Furthermore, the embodiments described above can be appropriately used in combination. Namely, for example, as described in the second to the fourth embodiments, if the monitoring target is the input/output ratios or the distortion compensation coefficients, the upper limit thresholds and the lower limit thresholds associated with the addresses may also be read in combination with the sixth embodiment. Furthermore, as described in the second to the fourth embodiments, if the monitoring target is the input/output ratios or the distortion compensation coefficients, in combination with the fifth embodiment, if the number of deviations the monitoring target deviates the allowable ranges reaches the number of settings, it may also be possible to determine that an abnormality has occurred in the distortion compensation.

Furthermore, in each of the embodiments, the distortion compensation is performed by using the distortion compensation coefficients stored in the LUT 223; however, the distortion compensation coefficients are not always performed by using the look-up table. Namely, the monitoring processes described in the embodiments may also be used in a case in which, for example, the distortion compensation coefficients are calculated by using a polynomial equation and the distortion compensation is performed by using the calculated distortion compensation coefficients.

Furthermore, in each of the embodiments, the action taken when an abnormality is detected in the distortion compensation is not the initialization of the look-up table. For example, if an abnormality is detected, a predetermined alarm may also be notified. Furthermore, if the distortion compensation that uses a polynomial equation instead of the look-up table is performed, when an abnormality is detected, the coefficients in the polynomial equation may also be initialized.

Furthermore, in each of the embodiments, the radio base station system that includes the REC device 100 and the RE device 200 has been described; however, the PD processing unit 220 according to each of the embodiments may also be provided in, for example, a radio base station device, or the like.

According to an aspect of an embodiment of the radio apparatus and the abnormality detecting method disclosed in the present invention, an advantage is provided in that an abnormality of the distortion compensation can be detected with high accuracy.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio apparatus comprising:
   an amplifier that amplifies electrical power of a signal that is wirelessly transmitted; and
   a processor that executes a process comprising:
   performing, by using a distortion compensation coefficient that compensates distortion generated in the amplifier, distortion compensation of an input signal;
   reading, from a predetermined memory, an upper limit threshold and a lower limit threshold that specify, in each of sections of the electrical power of the input signal, an allowable range and that increase, in the sections of the electrical power that is equal to or less than predetermined electrical power, width of the allowable range as the electrical power of the input signal is lower; and
   comparing the read upper limit and lower limit thresholds with a monitoring target which includes the distortion compensation coefficient used with respect to the input signal to monitor whether an abnormality is present in the distortion compensation of the input signal.

2. The radio apparatus according to claim 1, wherein the performing includes
   generating, on the basis of the electrical power of the input signal, an address in a look-up table that stores a plurality of distortion compensation coefficients in a plurality of respective addresses, and
   multiplying the distortion compensation coefficient stored in the generated address by the input signal, and
   the reading includes reading, from the predetermined memory, the upper limit and lower limit thresholds associated with the generated address.

3. The radio apparatus according to claim 1, wherein the reading includes reading the upper limit threshold and the lower limit threshold that shift, in the sections of the electrical power that exceeds predetermined electrical power, the allowable range compared with sections of the electrical power that is equal to or less than the predetermined electrical power.

4. The radio apparatus according to claim 1, wherein the comparing includes comparing, as the monitoring target, electrical power of a compensation signal obtained by multiplying the distortion compensation coefficient by the input signal with the read upper limit and lower limit thresholds.

5. The radio apparatus according to claim 1, wherein the comparing includes comparing, as the monitoring target, an electrical power ratio of a compensation signal obtained by multiplying the distortion compensation coefficient by the input signal to the input signal with the read upper limit and lower limit thresholds.

6. The radio apparatus according to claim 1, wherein the comparing includes comparing, as the monitoring target, the distortion compensation coefficient multiplied by the input signal with the read upper limit and lower limit thresholds.

7. The radio apparatus according to claim 1, wherein the process further comprises updating, on the basis of both the input signal and a feedback signal that is output and fed back from the amplifier, the distortion compensation coefficient that is used at the performing, and
   the comparing includes comparing, as the monitoring target, the updated distortion compensation coefficient with the read upper limit and lower limit thresholds.

8. The radio apparatus according to claim 1, wherein the comparing includes counting a number of deviations that the monitoring target deviates an allowable range specified by the read upper limit and lower limit thresholds and determining, when the number of deviations reaches a previously set number, that the abnormality is present in the distortion compensation of the input signal.

9. The radio apparatus according to claim 8, wherein the comparing includes setting the set number on the basis of the electrical power of the input signal.

10. The radio apparatus according to claim 1, wherein the performing includes
    acquiring the distortion compensation coefficient associated with the electrical power of the input signal from a look-up table that stores therein a plurality of distortion compensation coefficients associated with the electrical power of the signal, and multiplying the acquired distortion compensation coefficient by the input signal, and
    updating, on the basis of both the input signal and a feedback signal that is output and fed back from the amplifier, the distortion compensation coefficients stored in the look-up table, and the comparing includes initializing the look-up table when it is determined that the abnormality is present in the distortion compensation of the input signal.

11. An abnormality detecting method that is performed by radio apparatus that includes an amplifier that amplifies electrical power of a signal that is wirelessly transmitted, the abnormality detecting method comprising:

performing, by a processor, distortion compensation of an input signal by using a distortion compensation coefficient that compensates distortion generated in the amplifier;

reading, from a predetermined memory, an upper limit threshold and a lower limit threshold that specify, in each of sections of the electrical power of the input signal, an allowable range and that increase, in the sections of the electrical power that is equal to or less than predetermined electrical power, width of the allowable range as the electrical power of the input signal is lower; and comparing the read upper limit and lower limit thresholds with a monitoring target which includes the distortion compensation coefficient used with respect to the input signal to monitor whether an abnormality is present in the distortion compensation of the input signal.

* * * * *